(12) United States Patent
Sugahara et al.

(10) Patent No.: US 8,080,450 B2
(45) Date of Patent: Dec. 20, 2011

(54) METHOD OF MANUFACTURING SEMICONDUCTOR THIN FILM

(75) Inventors: Kazuyuki Sugahara, Chiyoda-ku (JP); Naoki Nakagawa, Chiyoda-ku (JP); Shinsuke Yura, Chiyoda-ku (JP); Toru Takeguchi, Chiyoda-ku (JP); Tomoyuki Irizumi, Chiyoda-ku (JP); Kazushi Yamayoshi, Chiyoda-ku (JP); Atsuhiro Sono, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 33 days.

(21) Appl. No.: 12/596,453

(22) PCT Filed: Dec. 5, 2007

(86) PCT No.: PCT/JP2007/073456
§ 371 (c)(1),
(2), (4) Date: Oct. 19, 2009

(87) PCT Pub. No.: WO2008/129719
PCT Pub. Date: Oct. 30, 2008

(65) Prior Publication Data
US 2010/0112790 A1 May 6, 2010

(30) Foreign Application Priority Data

Apr. 18, 2007 (JP) .................. 2007-109715

(51) Int. Cl.
*H01L 21/84* (2006.01)
*H01L 21/00* (2006.01)
*H01L 21/205* (2006.01)

(52) U.S. Cl. ........ 438/149; 438/166; 438/482; 438/486; 438/487; 438/488; 257/E21.134; 257/E21.347; 257/E21.412; 257/E21.572

(58) Field of Classification Search ............. 257/E21.09, 257/E21.412, E21.572, E21.134, E21.347, 257/E21.413
See application file for complete search history.

(56) References Cited

U.S. PATENT DOCUMENTS 5,498,904 A * 3/1996 Harata et al. .................. 257/623
(Continued)

FOREIGN PATENT DOCUMENTS

JP 3 62971 3/1991
(Continued)

OTHER PUBLICATIONS

Nakata, Y. et al., "Crystallization of an a-Si film by a Nd:YAG pulse laser beam with linear polarization", Digest of Technical Papers 2000 International Workshop on Active-Matrix Liquid Crystal Displays (AM-LCD2000), p. 265-268, (2000).

(Continued)

*Primary Examiner* — Mohsen Ahmadi
(74) *Attorney, Agent, or Firm* — Oblon, Spivak, McClelland, Maier & Neustadt, L.L.P.

(57) ABSTRACT

On a translucent substrate, an insulating film having a refractive index n and an amorphous silicon film are deposited successively. By irradiating the amorphous silicon film with a laser beam having a beam shape of a band shape extending along a length direction with a wavelength $\lambda$, a plurality of times from a side of amorphous silicon film facing the insulating film, while an irradiation position of the laser beam is shifted each of the plurality of times in a width direction of the band shape by a distance smaller than a width dimension of the band shape, a polycrystalline silicon film is formed from the amorphous silicon film. Forming the polycrystalline silicon film forms crystal grain boundaries which extend in the width direction and are disposed at a mean spacing measured along the length direction and ranging from $(\lambda/n) \times 0.95$ to $(\lambda/n) \times 1.05$ inclusive, and crystal grain boundaries which, in a region between crystal grain boundaries adjacent to each other and extending in the width direction, extend in the length direction and are disposed at a mean spacing measured along the width direction and ranging from $(\lambda/n) \times 0.95$ to $(\lambda/n) \times 1.05$ inclusive.

9 Claims, 14 Drawing Sheets

U.S. PATENT DOCUMENTS

| | | | |
|---|---|---|---|
| 6,172,380 B1 | 1/2001 | Noguchi et al. | |
| 6,190,949 B1 | 2/2001 | Noguchi et al. | |
| 6,548,830 B1 | 4/2003 | Noguchi et al. | |
| 7,115,487 B2 * | 10/2006 | Kumomi et al. | 438/486 |
| 7,553,778 B2 * | 6/2009 | Sugahara et al. | 438/795 |
| 7,732,815 B2 * | 6/2010 | Takeguchi et al. | 257/66 |
| 7,791,073 B2 * | 9/2010 | Tokioka et al. | 257/59 |
| 2003/0032264 A1 * | 2/2003 | Nakajima et al. | 438/478 |
| 2003/0143375 A1 * | 7/2003 | Noguchi et al. | 428/143 |
| 2005/0026401 A1 | 2/2005 | Shimomura et al. | |
| 2005/0190314 A1 * | 9/2005 | Peng | 349/42 |
| 2006/0214229 A1 * | 9/2006 | Toyoda et al. | 257/347 |
| 2006/0267115 A1 * | 11/2006 | Takeguchi et al. | 257/411 |
| 2008/0048187 A1 * | 2/2008 | Takeguchi et al. | 257/64 |

FOREIGN PATENT DOCUMENTS

| | | |
|---|---|---|
| JP | 8 64837 | 3/1996 |
| JP | 9 55509 | 2/1997 |
| JP | 10 41234 | 2/1998 |
| JP | 11 145056 | 5/1999 |
| JP | 2003 17505 | 1/2003 |
| JP | 2005 64488 | 3/2005 |
| JP | 2005 72165 | 3/2005 |
| JP | 2005 244230 | 9/2005 |

OTHER PUBLICATIONS

Guosheng, Z. et al., "Growth of spontaneous periodic surface structures on solids during laser illumination", Physical Review B, vol. 26, No. 10, pp. 5366-5382, Nov. 15, 1982.

* cited by examiner

METHOD OF MANUFACTURING SEMICONDUCTOR THIN FILM

TECHNICAL FIELD

The present invention relates to a method of manufacturing a semiconductor thin film and a semiconductor device, and particularly relates to a method of manufacturing a semiconductor thin film in which a polycrystalline semiconductor thin film is formed by laser beam irradiation, and a semiconductor device including a semiconductor thin film made by the method.

BACKGROUND ART

Liquid crystal displays (LCDs (Liquid Crystal Displays)), which are one of the typical, conventionally-used devices for thin panels, have widely been used for a monitor and others of a personal computer and a handheld information terminal device, because of their advantages such as low electric power consumption, small size, and light weight. In recent years, the LCDs have also widely been used for television-specific applications, so that conventional cathode ray tube-based televisions are being replaced by liquid crystal display televisions.

Recently, electroluminescence EL (Electroluminescence) displays, which have overcome the problems of the LCDs, such as a limitation of a field of view and a contrast, a low response speed in displaying moving images, have also been used as next-generation devices for thin panels. The electroluminescence EL displays use a light emitter such as an EL element in a pixel display unit, and thus have characteristics such as self light-emitting properties, wide field-of-view performance, high contrast performance, and fast responsiveness, which have not yet been achieved by the LCDs.

For a TFT (Thin Film Transistor) used for the displays as described above, a MOS (Metal Oxide Semiconductor) structure that uses a semiconductor thin film is often used. Examples of the structures of the TFT include an inverted staggered type and a top gate type. Examples of the semiconductor thin films used for the TFT include an amorphous type and a polycrystalline type. The structures of the TFTs and the types of semiconductor thin films are selected as appropriate depending on intended purpose and performance of a display. For a small-size display, a polycrystalline-type semiconductor thin film is often used because size reduction in TFT can increase an aperture ratio of a display region.

As one of the methods of manufacturing a polycrystalline semiconductor thin film, there has been known a method of forming a polycrystalline semiconductor thin film by irradiating an amorphous semiconductor thin film formed on a substrate with a laser beam. It is known that a polycrystalline semiconductor thin film made of crystals having a size of approximately 0.2-1.0 μm can be formed with this method.

For example, according to Japanese Patent Laying-Open No. 2003-017505, a polycrystalline silicon layer (polycrystalline semiconductor thin film) is formed by irradiating an amorphous silicon layer (amorphous thin film) formed on a substrate with a laser beam.

Further, there has also been proposed a method of irradiating an amorphous semiconductor thin film with a laser beam to form a polycrystalline semiconductor thin film having a desired crystal size.

For example, according to Japanese Patent Laying-Open No. 2005-244230, a light reflective layer is formed at a portion of an amorphous silicon layer (amorphous thin film), and then a laser annealing process with use of an excimer laser having a wavelength of 308 nm or a green laser having a wavelength of 532 nm is conducted. With this process, a polysilicon layer (polycrystalline semiconductor thin film) having a relatively large polysilicon grain size (a diameter of approximately 0.3-0.4 μm) is formed in a portion that is not covered with the light reflective layer, and a polysilicon layer having a relatively small polysilicon grain size (a size smaller by approximately 0.1 μm in diameter) is formed in a portion of the amorphous silicon layer that is covered with the light reflective layer.

There has also been known a method of manufacturing a TFT that uses a polycrystalline semiconductor thin film formed as described above. Specifically, a gate insulating film made of silicon oxide or the like is initially formed on the polycrystalline semiconductor thin film. On the gate insulating film, a gate electrode is formed. The gate insulating film is used as a mask to introduce impurities such as phosphorus or boron into the polycrystalline semiconductor thin film, to thereby form source/drain regions. Subsequently, an interlayer insulating film is formed to coat the gate electrode and the gate insulating film. Subsequently, a contact hole reaching each of the source/drain regions is made in the interlayer insulating film and the gate insulating film. Through the contact hole, a metal film is formed to connect to each of the source/drain regions. The metal film is patterned to form each of source/drain electrodes. Consequently, the TFT is manufactured.

By forming a pixel electrode or a self light-emitting element to be connected to the drain electrode of the TFT described above, a display that uses the TFT is manufactured.

Furthermore, studies have been made on the correspondence between irradiation with a laser beam and the state of how crystal grains subjected to this irradiation are arranged. For example, according to Non-Patent Document 1, a silicon substrate is irradiated with 6000 pulses of a laser beam having linearly-polarized light and having a wavelength of 532 nm. After the silicon substrate is rotated by 90°, the laser beam is applied thereto once again. By doing so, it is said that a two-dimensional surface shape having a period of approximately 550 nm can be obtained on the silicon substrate.

Furthermore, Japanese Patent Laying-Open No. 2005-072165 shows that, when an amorphous silicon film on a glass substrate is irradiated with a laser beam, it is possible to obtain a polycrystalline silicon film that has concavities and convexities having a period of $\lambda/n (1+\sin \theta)$ on its surface, where the laser beam has a wavelength of $\lambda$, an atmosphere has a refractive index of n, and an angle formed by the laser beam and the normal to a plane of the amorphous silicon film is $\theta$.

Patent Document 1: Japanese Patent Laying-Open No. 2003-017505
Patent Document 2: Japanese Patent Laying-Open No. 2005-244230
Patent Document 3: Japanese Patent Laying-Open No. 2005-072165
Non-Patent Document 1: Y. Nakata, A. Shimoyama, and S. Horita, "Crystallization of an a-Si film by a Nd:YAG pulse laser beam with linear polarization", Digest of Technical Papers 2000 International Workshop on Active-Matrix Liquid Crystal Displays (AM-LCD2000), pp. 265-268

DISCLOSURE OF THE INVENTION

Problems to be Solved by the Invention

According to Japanese Patent Laying-Open No. 2003-017505, a polycrystalline semiconductor thin film can be formed by irradiating an amorphous thin film formed on a substrate with a laser beam. However, crystal grains of the obtained semiconductor thin film have great variations in uniformity. Accordingly, the size and number of the crystal grains present in a channel of a TFT that uses this semiconductor thin film vary greatly, resulting in great variations in characteristics of the TFT.

If such a TFT is used in a pixel or a peripheral drive circuit of a display, there occur great variations in voltage and current to be written in each pixel, and these variations are viewed as display unevenness. In other words, there arises a problem of deterioration in display characteristics of the display.

In the method of forming a reflective layer at a surface of an amorphous thin film so as to decrease a crystal grain diameter, as in Japanese Patent Laying-Open No. 2005-244230, a step of forming and removing the reflective layer is required, so that there arises a problem of complexity of the manufacturing step. Moreover, the reflective layer may peel off under the influence of a gas released from the amorphous thin film during the laser irradiation. This peeling may make nonuniform the laser beam to be applied to the amorphous thin film, and hence make nonuniform the grain diameter of the obtained polycrystalline semiconductor thin film.

When the polycrystalline semiconductor thin film formed by the laser beam irradiation as in Non-Patent Document 1 is used to fabricate a TFT, it becomes possible to make more uniform the size and the number of the crystal grains present in a channel of the TFT, so that it is considered that variations in characteristics of the transistor can be reduced. In this method, however, the substrate is rotated after the laser irradiation, and then the laser irradiation is conducted once again, so that there arises a problem of increase in step numbers.

The crystals obtained in the methods of Non-Patent Document 1 and Japanese Patent Laying-Open No. 2005-072165 have a large crystal grain diameter of approximately 0.53 μm. In the case of such a large crystal grain diameter, a distortion of the crystals, which is attributable to, for example, a difference in expansion coefficient between the crystals and an underlayer on which the crystals are formed, becomes large, resulting in that crystal defects are more likely to occur. If multiple crystal defects are randomly caused in the semiconductor thin film, they inhibit carrier transfer. Accordingly, there arises a problem of deterioration or variations in performance of the TFT fabricated with use of this semiconductor thin film. Furthermore, in the method of Japanese Patent Laying-Open No. 2005-072165, a refractive index of the atmosphere is 1 and unchangeable, so that the crystal grain diameter cannot be less than 0.5 μm unless a wavelength of the laser beam is changed.

Carriers accelerated by an externally-applied electric field repeat impact ionization in these defects, so that electron-hole pairs are formed. The formation of electron-hole pairs causes a problem of decrease in reliability of the transistor.

The present invention has been made to solve the above-described problems, and provides a method of forming a polycrystalline semiconductor thin film having a relatively small and uniform crystal grain size with a simple scheme. Furthermore, the present invention provides a semiconductor device in which variations in characteristics are suppressed with use of the relevant polycrystalline semiconductor thin film.

Means for Solving the Problems

The method of manufacturing a semiconductor thin film in the present invention includes the following steps.

Initially, an insulating film having a refractive index n is deposited on a translucent substrate. An amorphous thin film is deposited on the insulating film. A polycrystalline semiconductor thin film is formed from the amorphous thin film by irradiating the amorphous thin film with a laser beam which has a beam shape of a band shape extending along a length direction and has a wavelength λ, a plurality of times from a side of the amorphous thin film facing the insulating film, while an irradiation position of the laser beam is shifted each of the plurality of times in a width direction of the band shape by a distance smaller than a width dimension of the band shape.

The above-described step of forming the polycrystalline semiconductor thin film is conducted to form crystal grain boundaries which extend in the width direction and are disposed at a mean spacing measured along the length direction and ranging from $(\lambda/n) \times 0.95$ to $(\lambda/n) \times 1.05$ inclusive, and crystal grain boundaries which, in a region between crystal grain boundaries adjacent to each other and extending in the width direction, extend in the length direction and are disposed at a mean spacing measured along the width direction and ranging from $(\lambda/n) \times 0.95$ to $(\lambda/n) \times 1.05$ inclusive.

A semiconductor device according to the present invention includes: an insulating film; and a semiconductor thin film. The insulating film has a refractive index n ranging from 1.4 to 2.0 inclusive. The semiconductor thin film is provided on the insulating film, has a transistor formed thereat, and has a film thickness ranging from 60 nm to 150 nm inclusive. Crystal grains in the semiconductor thin film are arranged in at least one direction at a mean spacing ranging from $(\Lambda/n) \times 0.95$ nm to $(\Lambda/n) \times 1.05$ nm inclusive, where Λ is a value ranging from 390 nm to 640 nm inclusive.

Effects of the Invention

With the method of manufacturing a semiconductor thin film according to the present invention, there are formed crystal grain boundaries which extend in the width direction and are located with a period of approximately λ/n measured along the length direction. Furthermore, there are formed crystal grain boundaries which, in a region between crystal grain boundaries adjacent to each other and extending in the width direction, extend in the length direction and are located with a period of approximately λ/n measured along the width direction. It is thereby possible to obtain a polycrystalline semiconductor thin film having uniform crystal grains.

With the semiconductor device according to the present invention, it is possible to obtain a semiconductor device in which variations in characteristics are suppressed.

DESCRIPTION OF THE REFERENCE SIGNS

BL, BW, BW1-BW5: crystal grain boundary, GR: crystal grain, 1: translucent substrate, 2: diffusion-preventing film, 3, 31: insulating film, 4: amorphous silicon film, 6: polycrystalline silicon film.

BEST MODES FOR CARRYING OUT THE INVENTION

Embodiments of the present invention will hereinafter be described based on the drawings.

First Embodiment

In the present embodiment, a polycrystalline silicon film is formed as a semiconductor thin film of the present invention.

Figure 1A:
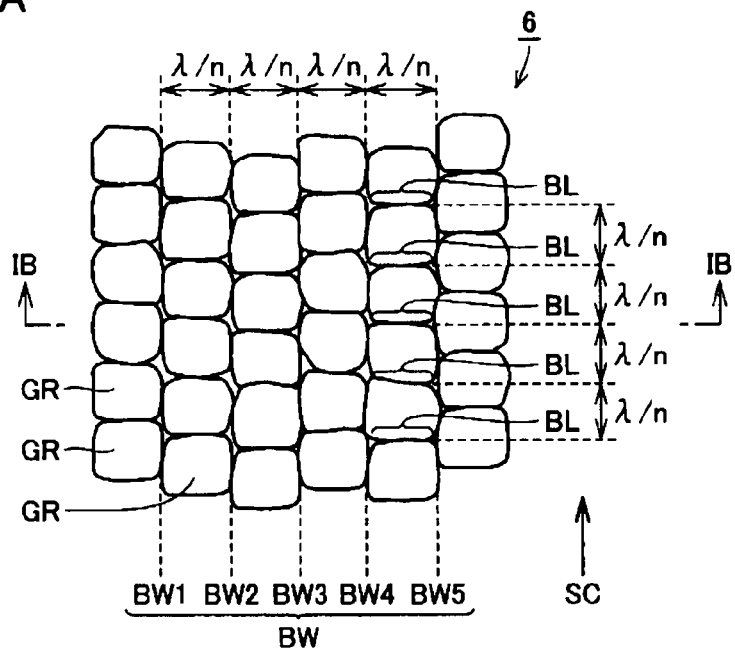
FIG. 1A is a plan view that schematically shows a configuration of a semiconductor thin film in a first embodiment of the present invention.
Figure 1B:
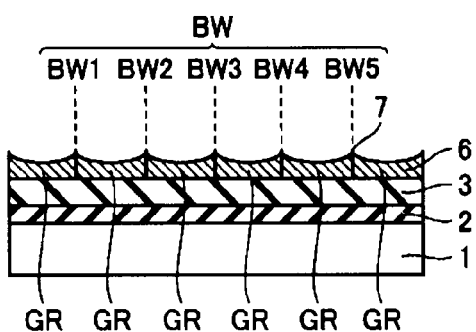
FIG. 1B is a schematic cross-sectional view taken along a line IB-IB in FIG. 1A.

Initially, description will be made on a configuration of a polycrystalline semiconductor thin film obtained by a method of manufacturing a semiconductor thin film in the present embodiment. FIG. 1A is a plan view that schematically shows a configuration of a semiconductor thin film in a first embodiment of the present invention. FIG. 1B is a schematic cross-sectional view taken along a line IB-IB in FIG. 1A.

With reference to FIGS. 1A and 1B, a polycrystalline silicon film (polycrystalline semiconductor thin film) 6 is formed on an insulating film 3. Insulating film 3 is formed on a diffusion-preventing film 2. Diffusion-preventing film 2 is formed on a translucent substrate 1.

Polycrystalline silicon film 6 has multiple crystal grains GR. Here, crystal grain GR refers to a portion surrounded by crystal grain boundaries generated by mutual collision of growing crystals when polycrystalline silicon film 6 is formed by being poly-crystallized through laser beam irradiation.

Polycrystalline silicon film 6 has a plurality of crystal grain boundaries BW extending in one direction (a direction of an arrow SC in the drawing) and a plurality of crystal grain boundaries BL extending in another direction (a direction orthogonal to the direction of arrow SC in the drawing).

Crystal grain boundaries BW are located with a period corresponding to a length of approximately $\lambda/n$ measured along the other direction (the direction orthogonal to the direction of arrow SC in the drawing). A mean value of the period falls within a range of $\lambda/n \pm 5\%$. In other words, crystal grain boundaries BW are disposed at a mean spacing ranging from $(\lambda/n) \times 0.95$ to $(\lambda/n) \times 1.05$ inclusive and measured along the other direction (the direction orthogonal to the direction of arrow SC in the drawing). $\lambda/n$ is, for example, approximately 380 nm. It is noted that $\lambda$ is a wavelength of a laser used for poly-crystallization of polycrystalline silicon film 6, and n is a refractive index of insulating film 3. In FIGS. 1A and 1B, a plurality of crystal grain boundaries BW1-BW5 which extend in parallel with one another are illustrated as crystal grain boundaries BW.

In a region between adjacent crystal grain boundaries BW extending in the one direction (the direction of arrow SC in the drawing), crystal grain boundaries BL are located with a period corresponding to a length of approximately $\lambda/n$ measured along the adjacent one direction (the direction of arrow SC in the drawing). A mean value of the period falls within a range of $\lambda/n \pm 5\%$. In other words, in a region between crystal grain boundaries BW adjacent to each other, crystal grain boundaries BL are disposed at a mean spacing ranging from $(\lambda/n) \times 0.95$ to $(\lambda/n) \times 1.05$ inclusive and measured along the one direction (the direction of arrow SC in the drawing). It is noted that in FIG. 1A, a reference character BL for crystal grain boundaries BL are representatively provided only to the region between crystal grain boundary BW4 and crystal grain boundary BW5, for the sake of facilitating visualization. However, crystal grain boundaries BL are also formed in a region between other adjacent crystal grain boundaries BW.

A surface of polycrystalline silicon film 6 has a crystal grain boundary portion protrusion 7 pointing upward from translucent substrate 1, at each portion of crystal grain boundaries BL, BW. Preferably, the surface of polycrystalline silicon film 6 has a mean roughness Ra of 3 nm or less.

For insulating film 3, it is possible to use, for example, a silicon oxide ($SiO_2$) film having a refractive index n=1.4. The silicon oxide film has a film thickness of, for example, 100-400 nm, and more specifically, for example, 290 nm. Diffusion-preventing film 2 has translucency, and it is possible to use, for example, a silicon nitride (SiN) film therefor. The silicon nitride film has a film thickness of, for example, 40-150 nm, and more specifically, for example, 90 nm. For translucent substrate 1, it is possible to use, for example, a glass substrate or a quartz substrate.

Next, description will be made on an outline of a method of manufacturing the semiconductor thin film according to the present embodiment.

Figure 2:
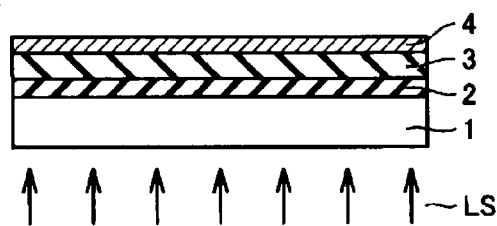
FIG. 2 is a cross-sectional view that schematically shows a step of manufacturing the semiconductor thin film in the first embodiment of the present invention.

FIG. 2 is a cross-sectional view that schematically shows a step of manufacturing the semiconductor thin in the first embodiment of the present invention. With reference to FIG. 2, diffusion-preventing film 2, which is a silicon nitride film having a film thickness of 40-150 nm, for example, is formed on insulating translucent substrate 1 such as a glass substrate or a quartz substrate, with use of a CVD (Chemical Vapor Deposition) method. It is noted that diffusion-preventing film 2 is provided for the purpose of preventing diffusion of movable ions of Na (sodium) and the like from the glass substrate to polycrystalline silicon film 6, and is not limited to the above-described conditions.

With use of the CVD method, insulating film 3, which is a silicon oxide film having a film thickness of 100-400 nm, for example, is deposited on diffusion-preventing film 2.

Next, amorphous silicon film 4 is formed on insulating film 3 by the CVD method. Amorphous silicon film 4 has a film thickness of 60-150 nm, for example, and preferably 60-80 nm. Amorphous silicon film 4 formed by the CVD method contains much hydrogen in itself, and hence is preferably subjected to annealing at a high temperature, which annealing serves as processing for reducing a hydrogen content. For example, amorphous silicon film 4 is subjected to annealing at approximately 480° C. for 45 minutes in a chamber containing a nitrogen atmosphere, for example, and held in a low-vacuum state.

It is noted that diffusion-preventing film 2, insulating film 3, and amorphous silicon film 4 are preferably formed in the same device or the same chamber in a successive manner.

Further, a material of each of diffusion-preventing film 2 and insulating film 3 is set to be a material having a melting point higher than a melting point of 1420° C. of amorphous silicon film 4.

Next, a natural oxide film formed at a surface of amorphous silicon film 4 is etched with a hydrofluoric acid or the like and removed. Next, an inert gas such as nitrogen is sprayed onto the surface of amorphous silicon film 4 to cause a state where oxygen is eliminated from the surface. In this state, amorphous silicon film 4 is irradiated with a pulsed laser beam LS from the translucent substrate 1 side.

Figure 3:
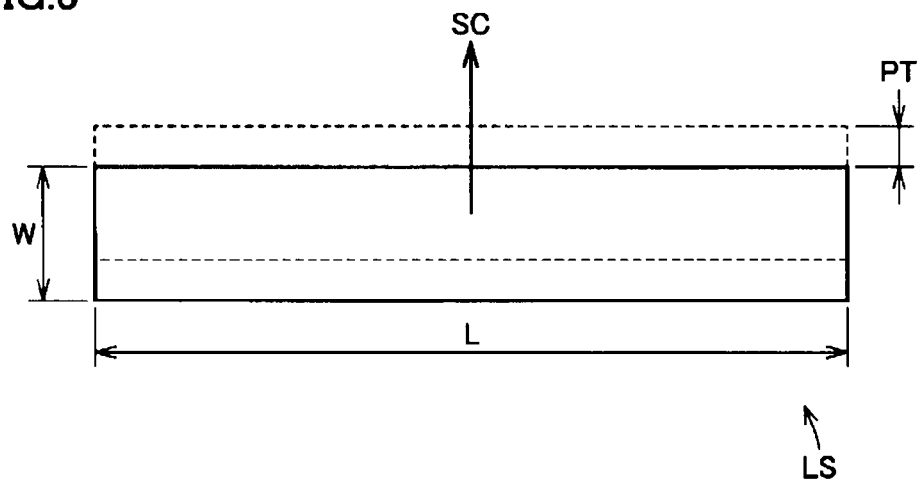
FIG. 3 is a plan view that schematically shows a beam shape of a laser beam used in the step of manufacturing the semiconductor thin film in the first embodiment of the present invention, and its scan direction.

FIG. 3 is a plan view that schematically shows a beam shape of the laser beam used in the step of manufacturing the semiconductor thin film in the first embodiment of the present invention, and its scan direction.

With reference to FIGS. 2 and 3, pulsed laser beam LS is identified as light which is emitted from a laser light source, passes through a prescribed optical system, and allow its shape to be converted into a band shape. For the light source, a second harmonic of a YAG laser (an oscillation wavelength $\lambda$=532 nm) is preferably used. The band shape of the beam is short in the width direction, and long in the length direction. In other words, this band shape extends along the length direction. This band shape has an approximately linear shape having a width dimension W of 60 μm and a length dimension L of 100 mm.

By irradiating amorphous silicon film 4 with a plurality of pulses of pulsed laser beam LS having this band shape, amorphous silicon film 4 is poly-crystallized, resulting in polycrystalline silicon film 6. The irradiation with pulsed laser beam LS is conducted by shifting a position of pulsed laser beam LS by a feeding pitch PT per pulse on amorphous silicon film 4 along a scan direction SC, which is the same as the width direction of the beam shape. Feeding pitch PT is smaller than width dimension W of the band shape of the beam, and is, for example, 2 μm. Each pulse has a laser power density of, for example, 250 mJ/$cm^2$.

By irradiating amorphous silicon film 4 with a plurality of pulses of pulsed laser beam LS through scanning, as described above, it is possible to form polycrystalline silicon film 6 over a large area. By conducting the above-described scanning once on amorphous silicon film 4, polycrystalline silicon film 6 shown in FIG. 1 can be obtained. In other words, there are formed a plurality of crystal grain boundaries BW extending along scan direction SC, and a plurality of crystal grain boundaries BL extending along a direction orthogonal to scan direction SC.

Crystal grain boundaries BW are formed with a period corresponding to a length of approximately $\lambda/n$ measured along the direction orthogonal to scan direction SC. Furthermore, in a region between crystal grain boundaries BW extending in scan direction SC, crystal grain boundaries BL are formed with a period corresponding to a length of approximately $\lambda/n$ measured along the adjacent one direction (the direction of arrow SC in the drawing). For example, $\lambda/n=380$ nm under the conditions of, for example, wavelength $\lambda=532$ nm and refractive index $n=1.4$.

Next, description will be made on a principle on which crystal grains GR as described above are obtained, the principle being estimated by the present inventors.

According to a document: Zhou Guosheng, P. M. Fauchet, and A. E. Siegman, "Growth of spontaneous periodic surface structures on solids during laser illumination", Physical Review B, vol. 26, No. 10, 15 Nov. 1982, pp. 5366-5382, if a laser beam having a wavelength of $\lambda$ is applied from an amorphous semiconductor layer side, a grain boundary portion protrudes when a molten semiconductor is crystallized. These protruding portions function as a diffraction grating, so that 0-th order light and ±1st order light in diffracted light of the laser beam, which has been directed into the semiconductor layer, interfere with each other to form a thermal distribution having a pitch corresponding to a wavelength $\lambda$. A high-temperature section in the thermal distribution matches with the protruding portions, and thus repetitive irradiation with the pulsed laser beam tends to cause generation of protruding portions at a pitch of wavelength $\lambda$.

It should be noted here that a period of the protruding portions is determined by a wavelength of the laser beam in the nitrogen atmosphere above the amorphous semiconductor layer. The nitrogen atmosphere has a refractive index of approximately 1, and hence a period of the protruding portions takes a value obtained by dividing a wavelength of the laser beam by the refractive index of the nitrogen atmosphere, namely, $\lambda/1$ (=532 nm).

In the present embodiment, however, laser beam LS is applied from translucent substrate 1 side (FIG. 2), so that crystal grain boundary portion protrusion 7 (FIG. 1B) formed at polycrystalline silicon film 6 does not function as a diffraction grating. The present inventors have found that, when laser beam LS is applied from translucent substrate 1 side, concavities and convexities at an interface of insulating film 3 (e.g. $SiO_2$ film), which is in contact with the semiconductor layer, function as a diffraction grating.

In the state where no amorphous silicon film 4 was formed, concavities and convexities of a surface of an $SiO_2$ film used as insulating film 3 were evaluated immediately after the $SiO_2$ film was deposited on the substrate. For the evaluation, an AFM (Atomic Force Microscope) was utilized. The results show that the minimum spacing was 0.1 μm and mean roughness Ra ranged from 0.5 nm to 2.0 nm inclusive. It is noted that only a minute region of 3 μm×3 μm in the substrate can be measured with the AFM, and thus mean roughness Ra of the $SiO_2$ film varies within the substrate.

Among the concavities and convexities at the above-described $SiO_2$ film, the ones having a spacing approximately equal to the wavelength of the laser beam in the $SiO_2$ film function as a diffraction grating, resulting in a periodic thermal distribution in the semiconductor film. Solidification of molten silicon starts at a lower temperature section and ends at a higher temperature section in the periodic thermal distribution. As a result, crystal grain boundaries BL, BW are formed at the higher temperature sections in the periodic thermal distribution, resulting in polycrystalline silicon film 6 having a grain diameter equal to the wavelength of the laser beam in the $SiO_2$ film. The $SiO_2$ film has a refractive index n of 1.4, and consequently, crystal grain boundaries BL, BW are generated at a pitch of 380 nm, which is equal to 1/1.4 of wavelength $\lambda=532$ nm of YAG-2ω.

It is noted that, if the laser beam is applied from the amorphous semiconductor layer side as in the above-described document, there occurs a phenomenon in which crystal grain boundaries are additionally formed at positions each corresponding to the middle of the period of the periodic thermal distribution, namely, the middle of the period of the periodic protruding portions. In other words, a crystal grain diameter becomes a half of the wavelength of the laser beam. This is because ±2nd order diffracted light is also present, in addition to 0-th order diffracted light and ±1st order diffracted light, in the silicon film (Expression (6) in the above-described document), and the thermal distribution caused by the ±2nd order diffracted light has periods twice as many as the periods (a length one half of that) of the protruding portions, so that crystal grain boundaries are also formed at the positions each corresponding to the middle of the period of the protruding portions.

The periodic thermal distribution described above is also made in the case where the laser beam is applied from the translucent substrate side. In other words, there is made a periodic thermal distribution having a period corresponding to a half of the wavelength of the laser beam in the $SiO_2$ film. However, in the case where the laser beam is applied from the translucent substrate side, the laser beam in the $SiO_2$ film has a wavelength of 380 nm as described above, so that a length corresponding to a half of the wavelength has a value as small as 190 nm. Owing to the fact that crystal grains having a crystal grain diameter of approximately 0.3 μm are likely to be generated from the relation among a growth rate of the crystals, cooling time, and a film thickness, and the fact that the thermal distribution having the period corresponding to a half of the wavelength has a small amplitude, crystals having a size of 190 nm, which corresponds to a half of the wavelength, do not appear.

The present inventors have found that, in the case where a laser beam having a rectangular beam shape with a long axis and a short axis as shown in FIG. 3 is used, the periodic thermal distribution appears more remarkably in a direction parallel to the long axis direction (a lateral direction in the drawing). Therefore, as shown in FIG. 1A, there is demonstrated a strong tendency that crystal grain boundaries extending longer in a direction perpendicular to the length direction (the long axis direction) of the beam shape of laser beam LS, namely, extending longer in the width direction (the short axis direction) (direction SC in the drawing) are periodically arranged.

Furthermore, the present inventors have found that, by adjusting the intensity distribution in a beam of laser beam LS, it becomes possible to form polycrystalline silicon film 6 which has crystal grain boundaries extending longer also in the length direction of the beam shape (the direction orthogonal to direction SC in FIG. 1A), as a modification of the present embodiment. This modification will hereinafter be described.

Figure 4:
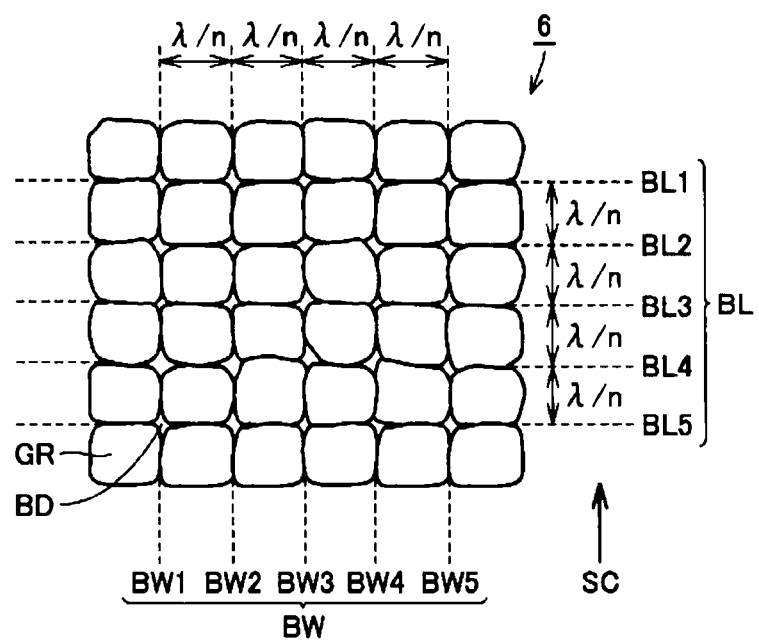
FIG. 4 is a plan view that schematically shows a configuration of a semiconductor thin film in a modification of the first embodiment of the present invention.

FIG. 4 is a plan view that schematically shows a configuration of a semiconductor thin film in the modification of the first embodiment of the present invention. Mainly with reference to FIG. 4, polycrystalline silicon film 6, which is a semiconductor thin film in the modification of the present embodiment, has a plurality of crystal grain boundaries BL extending longer in the length direction of the beam shape of applied laser beam LS (i.e. in the direction orthogonal to scan direction SC) along a plurality of crystal grains GR. In other words, crystal grain boundaries BL shown in FIG. 1 are not aligned along the length direction of the beam shape (the lateral direction in the drawing), whereas crystal grain boundaries BL in the present modification are formed such that crystal grain boundaries BL adjacent to each other with crystal grain boundary BW interposed therebetween are aligned along the length direction (the lateral direction in the drawing). It is noted that in FIG. 4, crystal grain boundaries BL1-BL5 are illustrated as crystal grain boundaries BL.

Figure 5A:
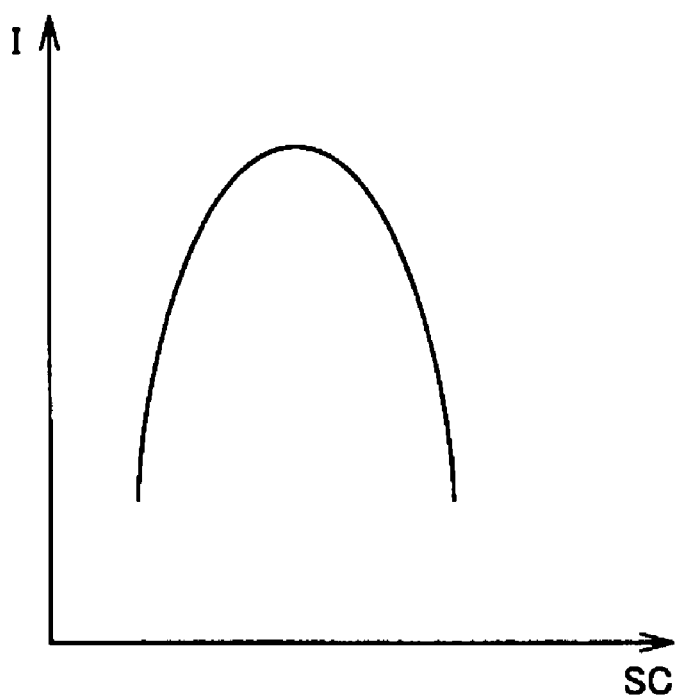
FIG. 5A is a graph that schematically shows a beam intensity distribution of the laser beam used in a method of manufacturing the semiconductor film in the first embodiment.
Figure 5B:
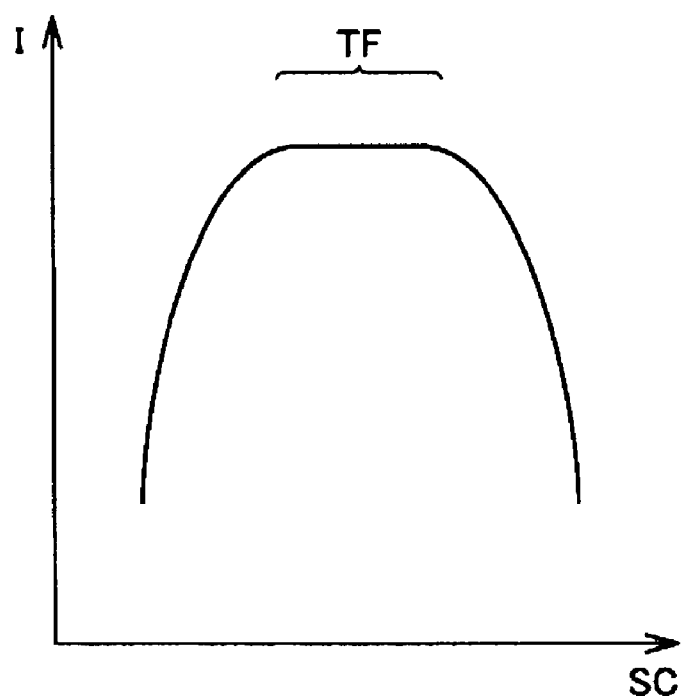
FIG. 5B is a graph that schematically shows a beam intensity distribution of the laser beam used in a method of manufacturing the semiconductor film in the modification of the first embodiment.

FIG. 5A is a graph that schematically shows a beam intensity distribution of the laser beam used in the method of manufacturing a semiconductor film in the first embodiment. FIG. 5B is a graph that schematically shows a beam intensity distribution of the laser beam used in the method of manufacturing a semiconductor film in the modification of the first embodiment. It is noted that the distribution is represented along the width direction of the beam shape, namely, along scan direction SC. With reference to FIGS. 5A and 5B, crystal grain boundaries BL1-BL5 (BL) shown in FIG. 4 can be obtained not by using laser beam LS which exhibits a beam intensity I having a Gaussian-type intensity distribution (FIG. 5A), but by using laser beam LS which exhibits a top flat-type intensity distribution that maintains a maximum intensity flatly as shown in a region TF (FIG. 5B). Region TF has a width of, for example, 10 μm.

Next, as to the fact that crystal grain boundaries BL1-BL5 (FIG. 4) that also extend longer also in the length direction of the beam shape are formed with use of the top flat-type laser beam LS, description will be made on the principle estimated by the present inventors.

As shown in FIG. 1B, the film thickness of a portion of polycrystalline silicon film 6, which corresponds to each of crystal grain boundaries BL, BW, is larger than the film thickness within a crystal grain. This is attributable to the fact that liquid silicon has a density of 2.53 g/cm$^3$ and solid silicon has a density of 2.30 g/cm$^3$, and hence silicon is a substance that has a density higher in a liquid state than in a solid state, as in water.

Silicon, which has been molten by a first irradiation with pulsed laser beam LS, is gradually solidified with its density decreased, namely, with its volume increased. The increase in volume causes the surrounding liquid silicon to be pushed away, resulting in that a region to be solidified at the last is pushed by solid silicon from opposite sides, and solidified in an elevated state. The region solidified at the last is a site where crystals have grown (solidified) on opposite sides, and hence a crystal grain boundary is formed in this region.

When a second irradiation with pulsed laser beam LS is conducted, laser beam LS having a wavelength of 532 nm, for example, has a penetration length to silicon (a depth of silicon at which light intensity becomes 1/e) as long as approximately 1000 nm, so that most of the laser beam applied to the silicon film having a thickness of approximately 100 nm transmits through the silicon film. At this time, a region having a larger film thickness absorbs more light than a region having a smaller film thickness does, and thus experiences temperature rise. A region at a high temperature is solidified at the last, so that there is produced an effect in which the position of the crystal grain boundary region of the silicon film, which has once achieved a large film thickness, is no longer changed even with the subsequent pulse irradiation.

The above-described effect matches with the periodic intensity distribution of the laser beam, which is generated by the interference of laser beam LS caused by the concavities and convexities at the interface between silicon and its underlayer, namely, insulating film 3, so that periodic crystal grain boundaries BW are formed. Here, an intensity of laser beam LS is more uniform in the length direction than in the width direction of the beam shape, and thus the periodic intensity distribution is more likely to be formed along the length direction. Consequently, crystal grain boundaries BW are initially formed such that they exhibit periodicity in the length direction of the beam shape and extend in the direction perpendicular to the length direction (i.e. in the width direction) of the beam shape (the state corresponding to FIG. 1).

When the intensity distribution in the width direction of the beam shape is of a Gaussian type (FIG. 5A), a periodic temperature distribution is less likely to be formed in the width direction. Therefore, further formation of crystal grain boundaries BL1-BL5 (FIG. 4) having periodicity along the width direction of the beam shape after the formation of crystal grain boundaries BW described above becomes difficult.

However, the concavities and convexities at the interface between the silicon film and its underlayer, namely, insulating film 3, are random and do not have orientation, and the periodic intensity distribution caused by the interference of laser beam LS does not depend upon a polarization state of laser beam LS, and hence by adopting the top flat-type intensity distribution in the width direction of the beam shape (FIG. 5B), the periodic temperature distribution can also be formed along the width direction. By doing so, crystal grain boundaries BL1-BL5 (FIG. 4) are formed such that they exhibit periodicity in the width direction of the beam shape and extend in the length direction of the beam shape.

However, even in the top flat-type intensity distribution, the width at which a constant intensity is exhibited is only approximately 10 μm. Therefore, crystal grain boundaries BL1-BL5 extending in the length direction are formed after the formation of crystal grain boundaries BW extending in the width direction.

Next, description will be made on the results of the study on laser wavelength λ suitable for the method of manufacturing a semiconductor thin film in the present embodiment, and a film thickness of formed polycrystalline silicon film 6.

As described above, the principle of the present invention is estimated as follows: minute concavities and convexities at insulating film 3, which are in contact with the semiconductor layer, function as a diffraction grating, so that the periodic thermal distribution is generated in the semiconductor layer. By allowing laser beam LS to diffract and cause interference in the semiconductor layer, the periodic thermal distribution is generated. In order that the periodic thermal distribution is generated with an industrial margin, appropriate ranges are required for a film thickness of the semiconductor film and wavelength λ of laser beam LS. In other words, diffracted light in laser beam LS is required to have a certain wavelength to cause interference in the semiconductor layer, and the semiconductor layer is required to have a film thickness accordingly.

Table 1 shows combinations of a film thickness of the polycrystalline silicon film and wavelength λ of the laser beam, with which the periodic crystal grains as described with use of FIG. 1 or 4 could be formed. It is noted that Table 1 shows the case where the periodic crystal grains were formed with use of O while the case where the periodic crystal grains were not formed with use of X.

TABLE 1

| silicon film thickness (nm) | laser wavelength (nm) | | | | | |
|---|---|---|---|---|---|---|
| | 308 | 340 | 390 | 532 | 640 | 1060 |
| 40 | X | X | X | X | X | X |
| 50 | X | X | X | X | X | X |

TABLE 1-continued

| silicon film thickness (nm) | laser wavelength (nm) | | | | | |
|---|---|---|---|---|---|---|
| | 308 | 340 | 390 | 532 | 640 | 1060 |
| 60 | X | X | O | O | X | X |
| 70 | X | O | O | O | O | X |
| 80 | X | O | O | O | O | X |
| 100 | X | X | O | O | O | X |
| 150 | X | X | X | O | O | X |
| 200 | X | X | X | X | X | X |

As shown in Table 1, periodic crystal grains can be obtained when the film thickness of polycrystalline silicon film 6 falls within a range from 60 nm to 150 nm inclusive. Further, periodic crystal grains can be obtained when wavelength λ of the laser beam falls within a range from 340 nm to 640 nm inclusive.

Here, the determination as to whether or not the periodic crystal grains were formed was made as follows.

Initially, the laser power density (mJ/cm$^2$) was adjusted such that a crystal grain diameter of around 300 nm were obtained. This adjustment was made from 200 mJ/cm$^2$ to 400 mJ/cm$^2$ in increments of 10 mJ/cm$^2$. Amorphous silicon film 4 was irradiated with laser beam LS at respective laser power densities, and crystal grain diameters of crystal grains GR obtained by these irradiations were evaluated.

There exist various methods of evaluating a crystal grain diameter (crystal grain boundary), and a Secco Etch method, which is generally used for observing a crystal grain boundary, was employed. It is noted that the Secco Etch method is a method of infiltrating a sample with a mixed solution of hydrofluoric acid and an aqueous solution of potassium dichromate ($K_2Cr_2O_7$) to thereby selectively etch a crystal grain boundary. Next, polycrystalline silicon film 6 having its crystal grain boundaries highlighted by Secco Etch was observed under an SEM (Scanning Electron Microscope).

The obtained SEM images were subjected to image processing. For the image processing, commercially-available software PopImaging (registered trademark) was used, and a section of 5 μm×5 μm in each SEM image was subjected to the image processing. Based on an area S of an image of each crystal grain GR, the software uses a relational expression of area $S=\pi R^2$ to output a mean value of a circle-equivalent radius R and a standard deviation of R.

The outputted data on a mean value of circle-equivalent radius R and an expression of $\pi R^2 = X^2$ were used to calculate a grain diameter corresponding to a length X of a side of a square. The calculated grain diameter was set as a value of a grain diameter in the present embodiment. Furthermore, a percentage of a standard deviation of R with respect to a mean value was calculated and set as a value of variations (%) in the present embodiment. As a preliminary study, the value of variations and the SEM images were compared. If the periodic crystal grains were observed as an SEM image, the value of the above-described variations was found to be 30% or less. Therefore, it was decided that a value of variations of 30% or less leads to the determination that the periodic crystal grains are made.

Figure 6:
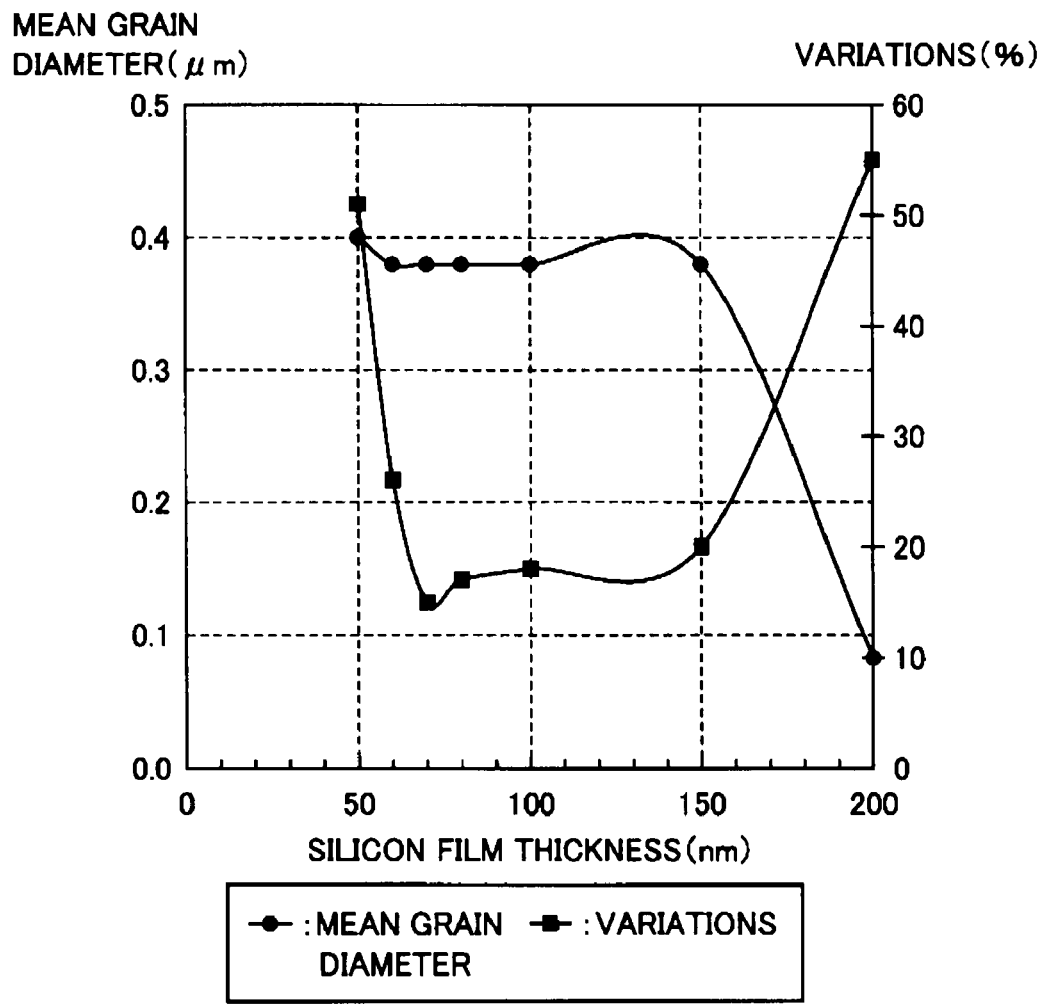
FIG. 6 is a graph that shows the relation between a film thickness of a polycrystalline silicon film, and a mean grain diameter and its variations in the case where a laser beam having a wavelength of 532 nm was used.

FIG. 6 is a graph that shows the relation between the film thickness of the polycrystalline silicon film, and the mean grain diameter and its variations in the case where a laser beam having a wavelength of 532 nm was used. Insulating film 3 being in contact with polycrystalline silicon film 6 was an $SiO_2$ film having a refractive index n=1.4. It is noted that the solid line in the graph is drawn for making the graph more visible.

With reference to FIG. 6, while the film thickness of polycrystalline silicon film 6 falls within the range from 60 nm to 150 nm, a mean grain diameter became 0.38 μm and variations became 30% or less. This shows that periodic crystal grains having a grain diameter of λ/n (=532 nm/1.4=380 nm=0.38 μm) were obtained at the film thickness of polycrystalline silicon film 6 ranging from 60 nm to 150 nm.

When polycrystalline silicon film 6 had a film thickness of 50 nm, variations took a value as large as 51%, so that periodic crystal grains were not obtained. When polycrystalline silicon film 6 had a film thickness of 200 nm, variations took a value as large as 55%, so that periodic crystal grains were not obtained, and the mean grain diameter took a value as small as 0.08 μm.

Figure 7:
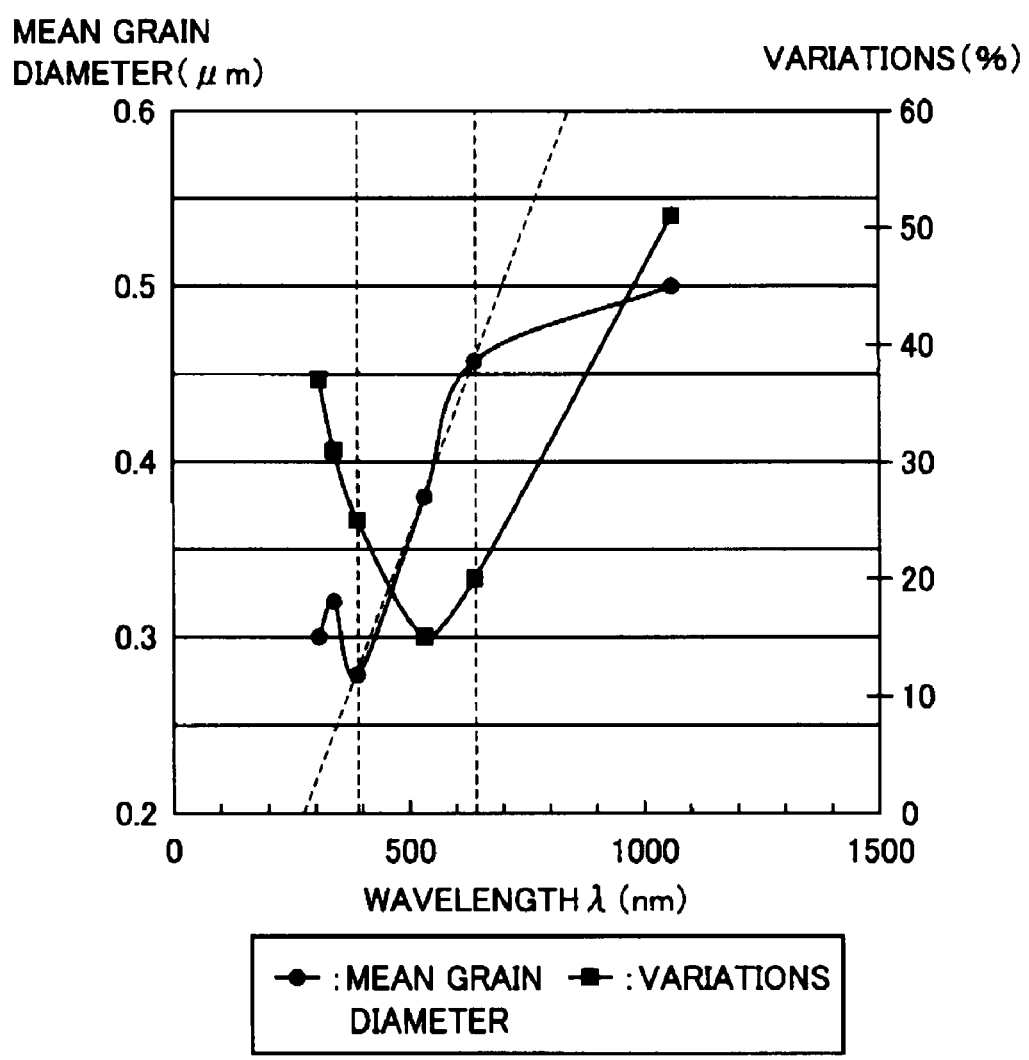
FIG. 7 is a graph that shows the relation between a wavelength of a laser beam, and a mean grain diameter of a polycrystalline silicon film and its variations in the case where the polycrystalline silicon film had a film thickness of 70 nm.

FIG. 7 is a graph that shows the relation between a wavelength of the laser beam, and a mean grain diameter of the polycrystalline silicon film and its variations in the case where the polycrystalline silicon film had a film thickness of 70 nm. Insulating film 3 being in contact with polycrystalline silicon film 6 was an $SiO_2$ film having a refractive index n=1.4.

With reference to FIG. 7, the mean grain diameter fell within a range from 0.28 μm to 0.46 μm at wavelength λ of laser beam LS ranging from 390 nm to 640 nm, so that the grain diameter satisfied the relation of λ/n (the relation of a diagonal dotted line in the drawing). Furthermore, variations were 30% or less, so that periodic crystal grains were obtained at the wavelength ranging from 390 nm to 640 nm. At other wavelengths λ, the grain diameter failed to satisfy the relation of λ/n, and variations were 30% or more, so that periodic crystal grains were not obtained. At the wavelength of 340 nm, at which periodic crystal grains were obtained in Table 1, periodic crystal grains were obtained in a small range from 5 μm×5 μm to 10 μm×10 μm. However, uniform crystal grains were not obtained in a larger range.

The results of Table 1 and FIGS. 6 and 7 are interpreted as follows. Decrease in wavelength λ of laser beam LS causes decrease in penetration length to the silicon film. The penetration length at wavelength λ=308 nm is 1 nm, so that the length (depth) at which diffracted light causes interference is decreased, resulting in that a thermal distribution for forming periodic crystal grains is not formed. In contrast, increase in wavelength λ of laser beam LS causes increase in penetration length. This means that the laser beam is not absorbed by the silicon film, so that a silicon film having a large film thickness is required for forming periodic crystal grains.

Even if a periodic thermal distribution is formed on a plane, periodic crystal grains cannot be obtained unless crystal growth continues for one period. If the silicon film thickness is large, the temperature distribution in a film thickness direction is disturbed by a thermal flow or the like in the lateral direction, so that crystal growth does not continue and periodic crystal grains cannot be obtained. Therefore, periodic crystal grains cannot be obtained in the case where the silicon film has a film thickness of 200 nm or more.

It is noted that variations in crystal grain diameter were smaller in the case where a beam of laser beam LS has the top flat-type intensity distribution (FIG. 5B) than in the case where a beam of laser beam LS has the Gaussian-type intensity distribution (FIG. 5A).

According to the present embodiment, as shown in FIG. 1, crystal grain boundaries BW, which extend in the width direction and are located with a period of approximately λ/n measured along the length direction, are formed. Furthermore, in a region between adjacent crystal grain boundaries BW extending in the width direction, crystal grain boundaries BL, which extend in the length direction and are located with a period of approximately λ/n measured along the width direction, are formed. It is thereby possible to obtain polycrystalline silicon film 6 having uniform crystal grains GR.

Preferably, a mean value of the period in each of the length direction and the width direction described above falls within a range of λ/n±5%. It is thereby possible to more reliably obtain polycrystalline silicon film 6 having uniform crystal grains GR.

Furthermore, top flat-type laser beam LS is used as shown in FIG. 5B. By doing so, as shown in FIG. 4, crystal grain boundaries BL are formed to be aligned along the length direction of the beam shape (i.e. in the lateral direction in the drawing), so that it is possible to obtain polycrystalline silicon film 6 having more uniform crystal grains GR.

Furthermore, amorphous silicon film 4 is deposited such that polycrystalline silicon film 6 has a film thickness ranging from 60 nm to 150 nm inclusive. As shown in FIG. 6, it is thereby possible to obtain polycrystalline silicon film 6 having small variations in grain diameter. Furthermore, it is possible to obtain relatively large crystal grains GR having a mean grain diameter of approximately 0.3 μm or more.

Furthermore, wavelength λ of laser beam LS is set to range from 390 nm to 640 nm inclusive. As shown in FIG. 7, the relation of mean grain diameter=λ/n (the relation of a diagonal dotted line in the drawing) is thereby satisfied, so that variations in grain diameter are suppressed.

Furthermore, mean roughness Ra of a surface of insulating film 3 is set to be 0.5 nm or more. It is thereby possible to generate diffracted light having an intensity sufficient enough for obtaining a periodic structure of crystal grains GR. Furthermore, mean roughness Ra of the surface of insulating film 3 is set to be 2.0 nm or less. It is thereby possible to suppress concavities and convexities of polycrystalline silicon film 6 formed on insulating film 3.

Furthermore, polycrystalline silicon film 6 is formed as a polycrystalline semiconductor thin film. It is thereby possible to obtain a semiconductor thin film having a much wider range of uses. For example, it is possible to form a thin-film transistor in which polycrystalline silicon film 6 is used as a channel region.

Furthermore, laser beam LS is directed into amorphous silicon film 4 from a side facing insulating film 3, so that at least any of translucent substrate 1, diffusion-preventing film 2, and insulating film 3 can function as an antireflective film. It is thereby possible to more efficiently irradiate amorphous silicon film 4 with a laser beam, when compared with the case where a laser beam is directed from a surface side of amorphous silicon film 4.

Furthermore, the irradiation is performed while an irradiation position of laser beam LS is shifted for each pulse. It is thereby possible to perform irradiation on a much larger area with the same number of pulses, when compared with the case where multiple pulse irradiation is performed at a fixed position. Accordingly, it is possible to form a semiconductor thin film with high mass productivity.

Furthermore, by applying laser beam LS while a nitrogen gas is being sprayed onto the semiconductor film, it is possible to suppress a protrusion height of crystal grain boundary portion protrusion 7 (FIG. 1B). It is thereby possible to decrease mean roughness Ra of a surface of obtained polycrystalline silicon film 6 to be as small as 3 nm or less. It is noted that, if surface roughness Ra is sufficiently decreased as such, a need to perform planarization processing for reducing surface concavities and convexities after poly-crystallization is eliminated.

Furthermore, diffusion-preventing film 2, insulating film 3, and amorphous silicon film 4 are formed successively in the same device or in the same chamber. It is thereby possible to prevent contaminants such as boron present in the atmosphere from being incorporated into an interface between respective films.

Furthermore, amorphous silicon film 4 is annealed at a high temperature. It is thereby possible to prevent the surface of polycrystalline silicon film 6 from being roughened owing to sudden detachment of hydrogen, caused in association with temperature rise when amorphous silicon film 4 is crystallized.

Furthermore, amorphous silicon film 4 has a film thickness of 150 nm or less, so that thermal conduction in an in-plane direction of the film is suppressed. It is thereby possible to suppress decrease, which is caused by the thermal conduction, in amplitude (a difference between the maximum and the minimum of the intensity) of the periodic thermal distribution, which is formed by the interference between 0-th order light and ±1st order light in laser beam LS, so that it is possible to increase a power margin with which periodic crystal grains can be obtained. It is noted that why the film thickness of amorphous silicon film 4 is particularly important is that Si has a thermal conductivity of 168 W/mK, which is significantly higher larger than 1.3-1.9 W/mk of $SiO_2$ or 3 W/mk of SiN.

Furthermore, a material of each of diffusion-preventing film 2 and insulating film 3 is set to be a material having a melting point higher than that of amorphous silicon film 4. It is thereby possible to adjust a laser power density ($mJ/cm^2$) of laser beam LS so as to allow amorphous silicon film 4 to melt, and so as not to allow diffusion-preventing film 2 and insulating film 3 to melt.

Furthermore, as the light source of laser beam LS, a second harmonic (oscillation wavelength λ=532 nm) of a YAG laser is used. It is thereby possible to use a high-power laser light source. It is thereby possible to increase an area of polycrystalline silicon film 6 formed by one irradiation, and hence decrease process cost.

Second Embodiment

In the present embodiment, a polycrystalline silicon film is formed as a semiconductor thin film in the present invention. With reference to FIG. 2, an $SiO_2$ film having a film thickness of 100-400 nm is formed as diffusion-preventing film 2 on translucent substrate 1 such as a glass substrate. On diffusion-preventing film 2, an SiN film having a film thickness of 40-150 nm is formed as insulating film 3.

It is noted that configurations other than the above-described ones in the present embodiment are similar to the configurations in the first embodiment described above, and hence the same elements are provided with the same reference characters, and the description thereof will not be repeated.

According to the present embodiment, the SiN film is in contact with amorphous silicon film 4. On a surface of the SiN film (an interface between the SiN film and amorphous silicon film 4) as well, there exist concavities and convexities having a minimum spacing of 0.1 μm and mean roughness Ra ranging from 0.5 nm to 2.0 nm inclusive, as in the $SiO_2$ film in the first embodiment. Among the concavities and convexities at the SiN film, the ones having a spacing approximately equal to a wavelength of the laser beam in the SiN film function as a diffraction grating, to thereby form a periodic thermal distribution in the semiconductor film. With this periodic thermal distribution, crystal grain boundaries BW and crystal grain boundaries BL are formed periodically.

It is noted that the SiN film has a refractive index of 2.0, and hence when laser beam LS having wavelength λ is applied, crystal grain boundaries BW and crystal grain boundaries BL are generated at a pitch of λ/2.0. For example, if a second harmonic of a YAG laser is used, this pitch is 266 nm, which is 1/2.0 of wavelength λ=532 nm.

Third Embodiment

In the present embodiment, a polycrystalline silicon film is formed as a semiconductor thin film in the present invention. With reference to FIG. 2, an SiN film having a film thickness of 40-150 nm is formed as diffusion-preventing film 2 on translucent substrate 1 such as a glass substrate. On diffusion-preventing film 2, an SiON film (silicon oxynitride film) having a film thickness of 100-400 nm is formed as insulating film 3.

For the method of forming the SiON film, it is possible to use a CVD method that uses $SiH_4$ (silane), $NH_3$ (ammonia), and $N_2O$ (dinitrogen monoxide), as a source gas. For example, the source gas is introduced by setting the flow rates of $SiH_4$, $NH_3$, and $N_2O$ to be 160 sccm (Standard Cubic Centimeters per Minute), 3000 sccm, and 200 sccm, respectively. Refractive index n of the SiON film obtained thereby is, for example, 1.65.

At a surface of the SiON film (an interface between the SiON film and amorphous silicon film 4) as well, there exist concavities and convexities having a minimum spacing of 0.1 µm and mean roughness Ra ranging form 0.5 nm to 2.0 nm inclusive, as in the $SiO_2$ film in the first embodiment. Among the concavities and convexities at the SiON film, the ones having a spacing approximately equal to a wavelength of the laser beam in the SiON film function as a diffraction grating, so that a periodic thermal distribution is formed in the semiconductor film.

The SiON film has refractive index n of 1.65, for example, so that when laser beam LS having wavelength λ is applied, crystal grain boundaries BW and crystal grain boundaries BL are generated at a pitch of λ/1.65. For example, if a second harmonic of a YAG laser is used, this pitch is 322 nm, which is 1/1.65 of wavelength λ=532 nm.

It is possible to allow the SiON film to have various refractive indices n by changing a flow ratio of $SiH_4$, $NH_3$ and $N_2O$ serving as a source gas in the CVD method. A variable range of refractive index n ranges from 1.4 to 2.0.

It is noted that configurations other than the above-described ones in the present embodiment are similar to the configurations in the first embodiment described above, so that the same elements are provided with the same reference characters, and the description thereof will not be repeated.

According to the present embodiment, refractive index n of insulating film 3 can be successively changed within a range from 1.4 to 2.0. It is thereby possible to obtain periodic polycrystalline silicon film 6 having a crystal grain diameter that falls within a range from 266 nm to 380 nm.

Fourth Embodiment

In the present embodiment, description will be made on the method of manufacturing a semiconductor thin film in the present invention, by showing practical examples. FIGS. 15-20 are schematic cross-sectional views that show the method of manufacturing a semiconductor thin film in a fourth embodiment of the present invention in sequential order of steps.

Figure 15:
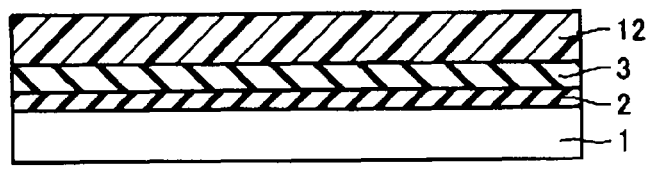
FIG. 15 is a schematic cross-sectional view that shows a first step of a method of manufacturing a semiconductor thin film in a fourth embodiment of the present invention.

With reference to FIG. 15, diffusion-preventing film 2 made of SiN (silicon nitride) and having a film thickness of 100 nm, and insulating film 3 made of $SiO_2$ and having a film thickness of 300 nm were deposited in this order on translucent substrate 1 identified as a glass substrate. Next, on insulating film 3, a resin film 12 made of polymethyl methacrylate (PMMA (Polymetyl methacrylate)) and having a film thickness of 1 µm was applied.

Figure 16:
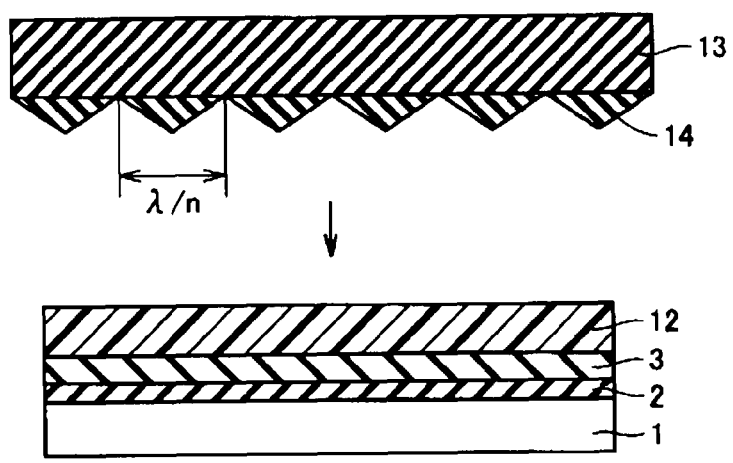
FIG. 16 is a schematic cross-sectional view that shows a second step of the method of manufacturing the semiconductor thin film in the fourth embodiment of the present invention.
Figure 21A:
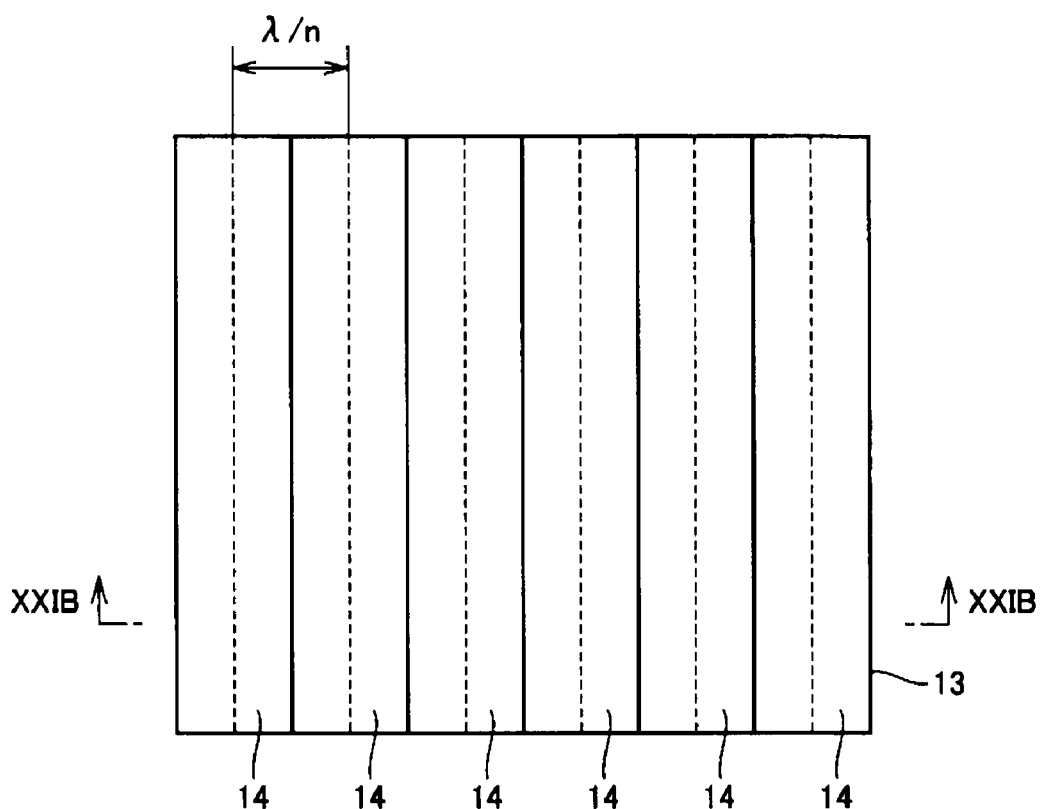
FIG. 21A is a plan view that schematically shows an original plate of a nanoimprint method used for manufacturing the semiconductor thin film in the fourth embodiment of the present invention.
Figure 21B:
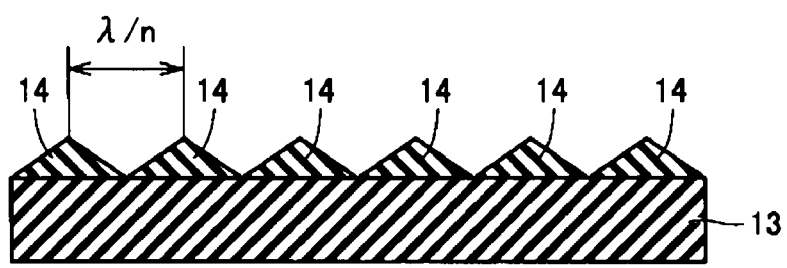
FIG. 21B is a schematic cross-sectional view taken along a line XXIB-XXIB in FIG. 21A.

Mainly with reference to FIG. 16, a quartz substrate 13, which serves as an original plate for implementing a nanoimprint method, is placed above translucent substrate 1. It is noted that, as shown in FIGS. 21A and 21B, stripe-like concave and convex portions 14, which were formed with a period of λ/n measured along the lateral direction in the drawing, were provided on quartz substrate 13. In the present embodiment, insulating film 3 being in contact with the amorphous silicon film (not shown in FIG. 16) was an $SiO_2$ film, and YAG-2ω having wavelength λ=532 nm was used as a laser, so that period λ/n was set to be 380 nm.

Figure 17:
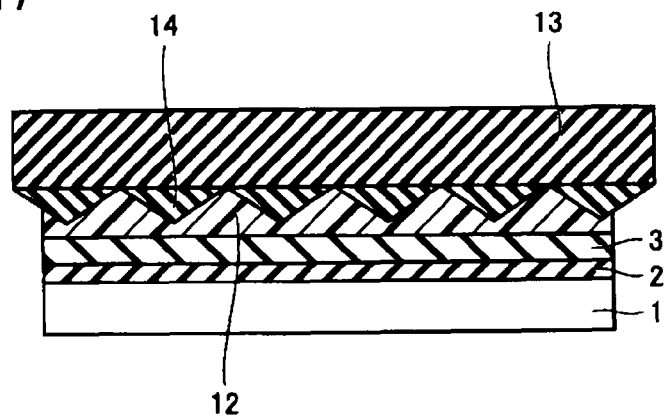
FIG. 17 is a schematic cross-sectional view that shows a third step of the method of manufacturing the semiconductor thin film in the fourth embodiment of the present invention.

With reference to FIG. 17, quartz substrate 13 heated to 200° C. was pressed onto translucent substrate 1 under a pressure of 1 MPa for 5 seconds such that heated concave and convex portions 14 were pressed against resin film 12 while they are closely attached to resin film 12. As a result, the concave and convex shape at the surface of concave and convex portions 14 was transferred to resin film 12. The size of quartz substrate 13 was set to be a size of 10 cm×10 cm, which is smaller than the size of translucent substrate 1. Accordingly, in order to transfer the concavities and convexities to the entire surface of resin film 12 above translucent substrate 1, the above-described transfer was conducted by successively shifting the position of quartz substrate 13 above translucent substrate 1. It is noted that a metal cylinder (roller) having the same width dimension as that of translucent substrate 1 and having concavities and convexities formed at its surface may also be used instead of quartz substrate 13, so as to improve throughput of the transfer step described above. By allowing the cylinder to be pressed against resin film 12 while rolling over resin film 12, the concave and convex shape of the surface of the cylinder is transferred to resin film 12.

Figure 18:
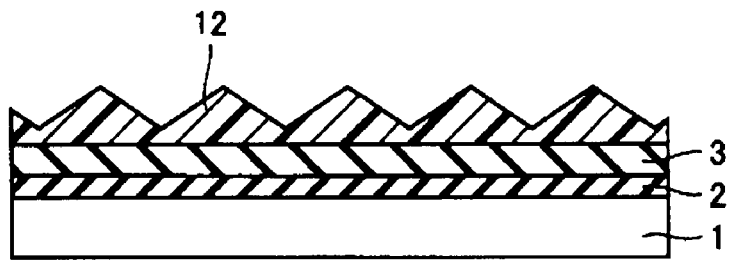
FIG. 18 is a schematic cross-sectional view that shows a fourth step of the method of manufacturing the semiconductor thin film in the fourth embodiment of the present invention.

With reference to FIG. 18, by the above-described transfer, the thinnest portion of resin film 12 was set to have a film thickness of 200 nm, while the thickest portion thereof was set to have a film thickness of 800 nm. It is noted that the film thickness of resin film 12 is not limited to these film thicknesses, and may be set as appropriate depending upon an etched amount, etching time, and others described below. Next, anisotropic dry etching was conducted so as to remove the whole resin film 12, and a part of insulating film 3 in the thickness direction. Specifically, an etching gas made of $CHF_3$ gas mixed with 40% of $O_2$ gas was used to conduct etching under a pressure of 1 Pa for 5 minutes.

Figure 19:
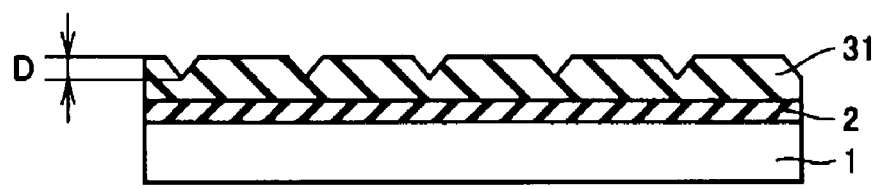
FIG. 19 is a schematic cross-sectional view that shows a fifth step of the method of manufacturing the semiconductor thin film in the fourth embodiment of the present invention.

Mainly with reference to FIG. 19, the whole resin film 12 (FIG. 18) was removed by the etching. During this etching, a portion of insulating film 3 located below the portion of resin film 12 having a small film thickness as shown in FIG. 18 was exposed earlier, and thus was etched more deeply. As a result, an insulating film 31 having a concave and convex shape corresponding to the concave and convex shape of the surface of resin film 12 was formed from insulating film 3. An etched amount D at a concave portion at the surface of insulating film 31 was set to be 20 nm. It is noted that if resin film 12 having a large thickness is provided prior to etching, a part of resin film 12 remains even if etched amount D of insulating film 31 reaches 20 nm. In this case, resin film 12 may be removed with use of an etching gas containing 100% of $O_2$ gas instead. Next, an outermost surface of insulating film 31 was etched with a dilute hydrofluoric acid, so that the surface of insulating film 31 was cleaned.

Figure 20:
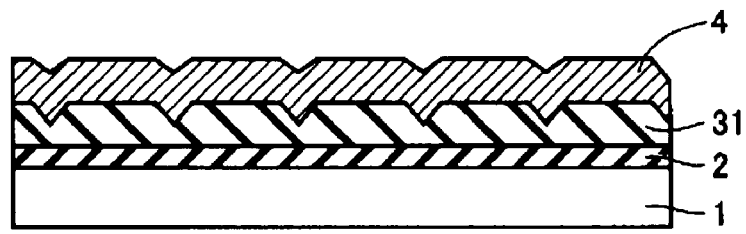
FIG. 20 is a schematic cross-sectional view that shows a sixth step of the method of manufacturing the semiconductor thin film in the fourth embodiment of the present invention.

With reference to FIG. 20, amorphous silicon film 4 having a film thickness of 70 nm was formed on insulating film 31 by the CVD method. It is noted that the film thickness of amorphous silicon film 4 is, for example, 60-150 nm, and preferably 60-80 nm. Next, annealing was conducted at 480° C. for 45 minutes so as to reduce a hydrogen content in amorphous silicon film 4.

Next, as in the first embodiment, a laser beam was applied. Specifically, amorphous silicon film 4 was irradiated, from translucent substrate 1 side, with a plurality of pulses of band-shape pulsed laser beam of a second harmonic of a YAG laser, so that amorphous silicon film 4 was poly-crystallized and a polycrystalline silicon film (not shown in FIG. 20) was formed. The laser beam irradiation was conducted through scanning in a direction parallel to the stripe of the concave and convex shape at insulating film 31 (i.e. in a direction corresponding to a direction perpendicular to a line XXIB-XXIB in FIG. 21A) at a feeding pitch PT (FIG. 3)=2 μm. The beam shape of the laser beam was set to have a top flat-type intensity distribution in the width direction (FIG. 5B). Each pulse was set to have a laser power density of 250 mJ/cm$^2$.

When the laser beam was applied, the concave and convex shape of insulating film 31 functioned as a diffraction grating, so that a periodic thermal distribution was formed in amorphous silicon film 4. Solidification of silicon, which has been molten in amorphous silicon film 4, starts at a lower temperature section of, and ends at a higher temperature section of, the periodic thermal distribution. Consequently, crystal grain boundaries boundaries BL and BW (FIG. 4) were formed at a higher temperature section of the periodic thermal distribution, and a polycrystalline silicon film was formed having a grain diameter equal to a wavelength of the laser beam in insulating film 31. The SiO$_2$ film, which was used as insulating film 31, has a refractive index n of 1.4, so that crystal grain boundaries BL and BW were generated at a pitch of 380 nm, which is equal to 1/1.4 of wavelength λ=532 nm of YAG-2ω.

It is noted that the configurations other than the above-described ones are approximately the same as those in the first embodiment described above, and hence the same or corresponding elements are provided with the same reference characters, and the description thereof will not be repeated.

According to the present embodiment, prior to the irradiation with the laser beam, the concave and convex shape having a period of λ/n was formed at insulating film 31 (here the SiO$_2$ film) by the nanoimprint method. Therefore, in the laser beam applied from translucent substrate 1 side, diffracted light generated by the concave and convex shape of insulating film 31 achieves an intensity higher than in the case where no concave and convex shape is formed. Accordingly, owing to the interference between 0-th order light and the diffracted light having a sufficient intensity, a sufficiently-large periodic thermal distribution is generated in the semiconductor film. Because of this large periodic thermal distribution, a margin of laser power for forming periodic crystal grain boundaries can be made larger than in the first embodiment.

Although PMMA was used as a material of resin film 12 in the present embodiment, the present invention is not limited thereto. For example, it is possible to use polystyrene, or a multilayer film formed of polystyrene and polymethyl methacrylate being stacked.

Although a thermoplastic resin was used as a material of resin film 12, the present invention is not limited thereto. For example, an ultraviolet curable resin can also be used. In this case, the ultraviolet curable resin is irradiated with ultraviolet rays while concave and convex portions 14 are closely attached thereto, to cure the resin.

Although SiO$_2$ was used as a material of insulating film 3, the present invention is not limited thereto. Another material may also be used as long as the concave and convex shape of insulating film 31 has a period of λ/n. For example, it is possible to use SiN or SiON.

Although a laser beam having wavelength λ=532 nm was used, the present invention is not limited thereto. It is also possible to use another wavelength as long as the concave and convex shape of insulating film 31 has a period of λ/n.

A period of the concave and convex shape of insulating film 31 is not necessarily set to be λ/n exactly. Periodic crystal grain boundaries are formed as long as a period of the concave and convex shape falls within a range of ±5% from λ/n.

Figure 22:
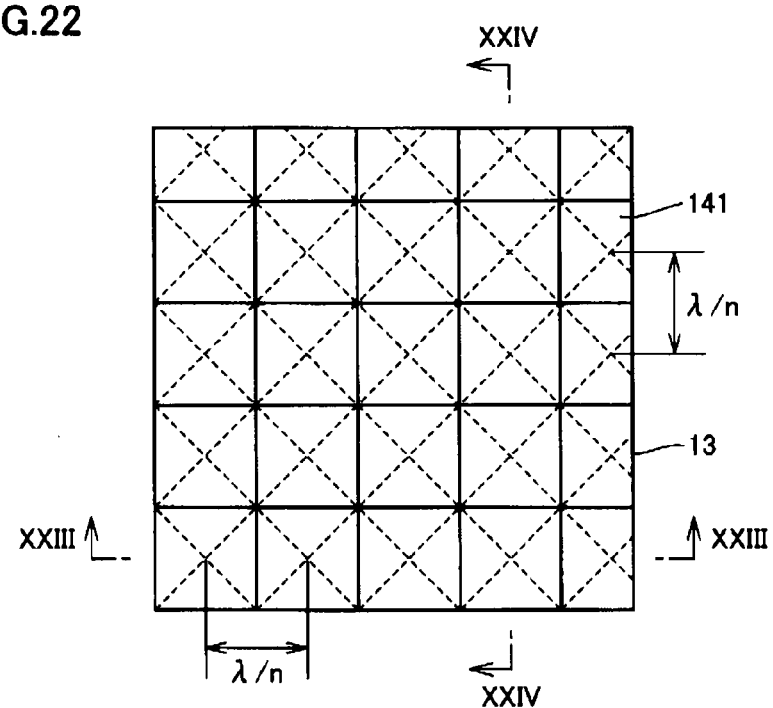
FIG. 22 is a plan view that schematically shows an original plate of a nanoimprint method used for manufacturing a semiconductor thin film in a first modification of the fourth embodiment of the present invention.
Figure 23:
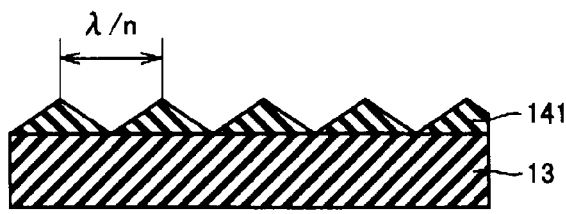
FIG. 23 is a schematic cross-sectional view taken along a line XXIII-XXIII in FIG. 22.
Figure 24:
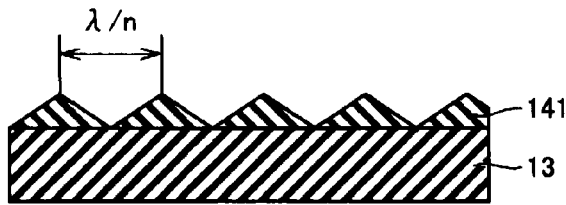
FIG. 24 is a schematic cross-sectional view taken along a line XXIV-XXIV in FIG. 22.

Next, description will be made on a first modification of the present embodiment. In the present modification, concave and convex portions 141 (FIGS. 22-24) are formed on quartz substrate 13, instead of concave and convex portions 14 (FIGS. 21A and 21B). Specifically, in the above-described embodiment, the concave and convex shape is formed with a period of λ/n in one direction (the lateral direction in the drawings in FIGS. 21A and 21B), whereas in the present modification, the concave and convex shape is formed with a period of λ/n in each of one direction (the lateral direction in the drawing in FIG. 22) and a direction orthogonal to the one direction (a vertical direction in the drawing in FIG. 22). It is noted that a dotted line in FIG. 22 represents a ridge of a protrusion of each of concave and convex portions 141.

According to the present modification, it is possible to form periodic crystal grain boundaries with a much larger laser power margin.

Figure 25:
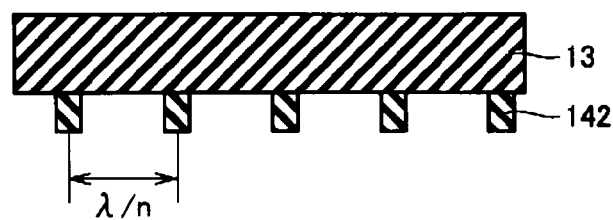
FIG. 25 is a cross-sectional view that schematically shows an original plate of a nanoimprint method used for manufacturing a semiconductor thin film in a second modification of the fourth embodiment of the present invention.

It is noted that the periodic concave and convex shape formed on quartz substrate 13 may have any shape in principle, as long as it has a size large enough for allowing generation of diffracted light of the laser beam. For example, in a second modification, as shown in FIG. 25, concave and convex portions 142 identified as rectangular prisms are provided with a period of λ/n on quartz substrate 13 in a stripe-like manner, namely, a groove-like manner. Concave and convex portions 142 may also be formed as columnar rectangular prisms such that they are arranged with a period of λ/n in each of one direction (a lateral direction in the drawing) and a direction orthogonal to the one direction.

However, if a step portion of the concave and convex shape on quartz substrate 13 in the thickness direction is made excessively large, a large step portion is also formed in the thickness direction of the polycrystalline silicon film to be eventually obtained from amorphous silicon film 4, and this step portion affects a breakdown voltage of the gate insulating film deposited on the polycrystalline silicon film. To prevent this, the dimension of the step portion of the concave and convex shape on quartz substrate 13 may be made smaller such that the step portion of the polycrystalline silicon film is 10 nm or less.

Fifth Embodiment

In the present embodiment, a semiconductor device provided with a thin-film transistor that includes the polycrystalline silicon film described in the first embodiment as a channel region, is formed as a semiconductor device in the present invention. It is noted that the same elements as the configurations in the first embodiment are provided with the same reference characters, and the detailed description thereof will not be repeated.

Figure 8:
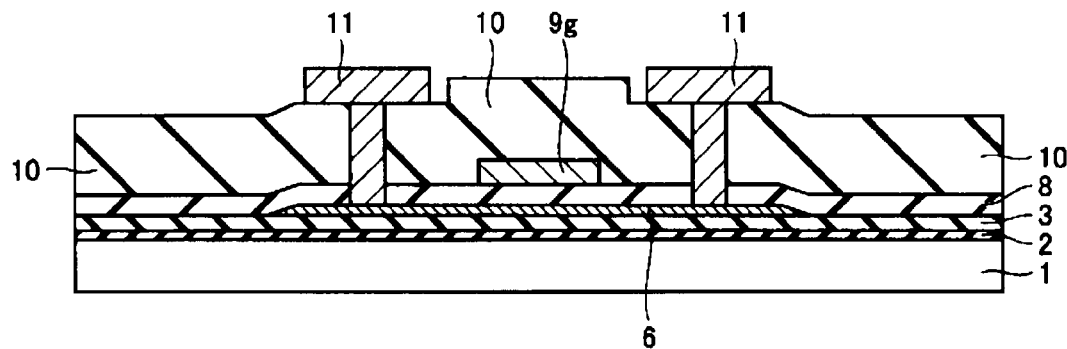
FIG. 8 is a cross-sectional view that schematically shows a configuration of a semiconductor device in a fifth embodiment of the present invention.

Initially, description will be made on an outline of a configuration of the semiconductor device in the present embodiment. FIG. 8 is cross-sectional view that schematically shows a configuration of the semiconductor device in the fifth embodiment of the present invention. With reference to FIG. 8, the semiconductor device in the present embodiment has translucent substrate 1, diffusion-preventing film 2, insulating film 3, polycrystalline silicon film 6, a gate insulating film 8, a gate electrode 9g, an interlayer insulating film 10, and a wiring 11.

Diffusion-preventing film 2 and insulating film 3 are formed in this order on translucent substrate 1. Diffusion-preventing film 2 and insulating film 3 are, for example, an SiN film and an $SiO_2$ film, respectively.

Polycrystalline silicon film 6 is formed on insulating film 3. Polycrystalline silicon film 6 has a source region and a drain region, both of which are conductive regions including impurities, and a channel region formed between the above-described conductive regions. Further, each end portion of polycrystalline silicon film 6 has a taper shape. Polycrystalline silicon film 6 has a grain diameter (a period length $\lambda/n$) ranging from 195 nm to 457.1 nm inclusive.

Gate insulating film 8 is an insulating layer formed to expand in contact with polycrystalline silicon film 6 such that it coats polycrystalline silicon film 6. Gate electrode 9g is formed on gate insulating film 8 to face the channel region described above. In other words, a thin-film transistor having gate electrode 9g is formed at polycrystalline silicon film 6. Interlayer insulating film 10 is formed to coat gate electrode 9g. Wiring 11 is provided to connect to each of the source region and the drain region via a contact hole provided in interlayer insulating film 10 and gate insulating film 8. Wiring 11 thereby functions as each of a source electrode and a drain electrode.

Although not shown, the semiconductor device may be a liquid crystal display provided with an insulating film having an opening made above the drain electrode, and a pixel electrode formed on the insulating film to be connected to the drain electrode via the opening, above the thin-film transistor described above.

Alternatively, the semiconductor device may be an organic field-effect display provided with a planarized film having an opening made above the drain electrode, an anode electrode formed on the planarized film to be connected to the drain electrode via the opening, and an EL layer and a cathode electrode formed on the anode electrode, above the thin-film transistor described above.

Figure 9:
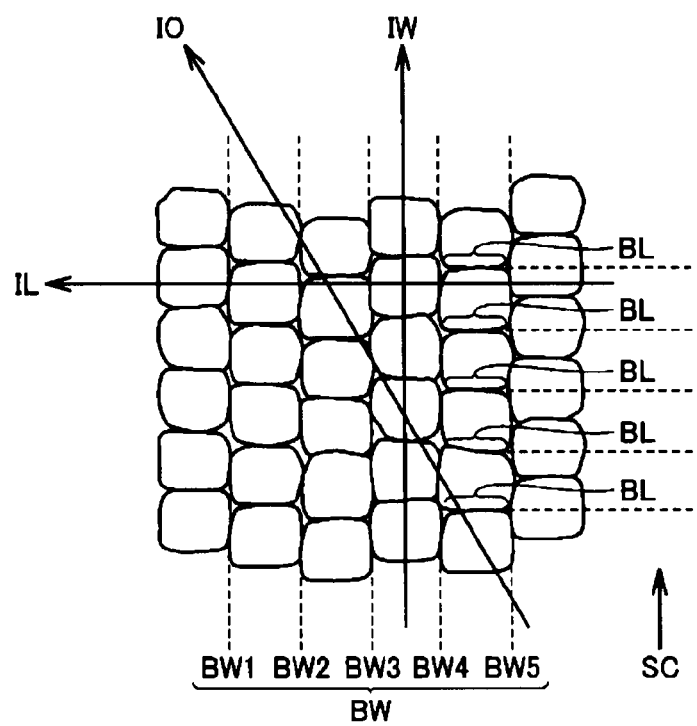
FIG. 9 is a plan view that schematically shows a configuration of a channel region of a thin-film transistor included in the semiconductor device in the fifth embodiment of the present invention.

Next, description will be made on the channel region in the above-described thin-film transistor. FIG. 9 is a plan view that schematically shows a configuration of the channel region of the thin-film transistor included in the semiconductor device in the fifth embodiment of the present invention. With reference to FIG. 9, the channel region is preferably provided such that its channel direction is approximately equal to a direction IL along the length direction of the beam shape, or a direction IW along the width direction of the beam shape, of laser beam LS. In other words, the channel direction is approximately the same as a direction along scan direction SC used in the irradiation with laser beam LS, or a direction along a direction orthogonal to scan direction SC.

When the channel direction is set along direction IW, a channel current flows approximately along crystal grain boundaries BW. Therefore, the channel current can flow without being blocked by crystal grain boundaries BW. When the channel direction is set along direction IL, the channel current flows approximately along crystal grain boundaries BL. Therefore, the channel current can flow without being blocked by crystal grain boundaries BL.

Figure 26:
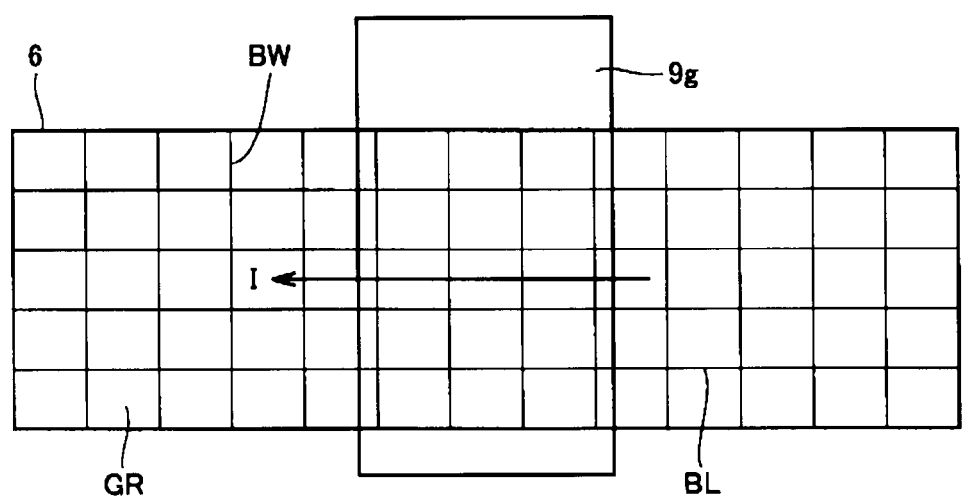
FIG. 26 is a plan view that diagrammatically shows a configuration of a channel region of the transistor in a semiconductor device in the fifth embodiment of the present invention.
Figure 27:
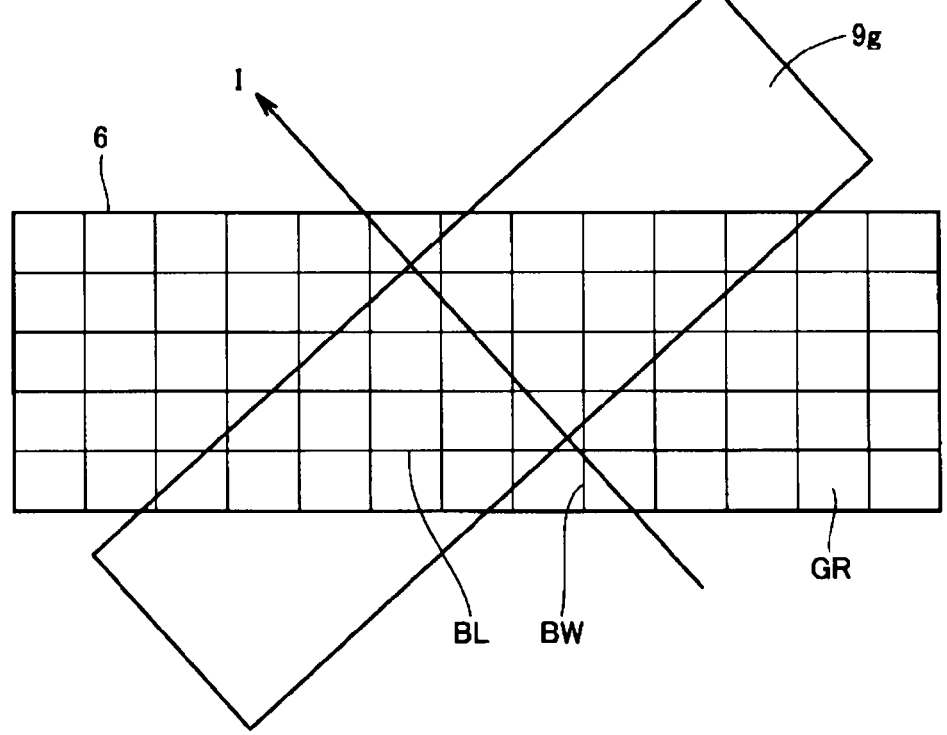
FIG. 27 is a plan view that diagrammatically shows a configuration of the channel region of a transistor related to the transistor in the semiconductor device in the fifth embodiment of the present invention.
Figure 28:
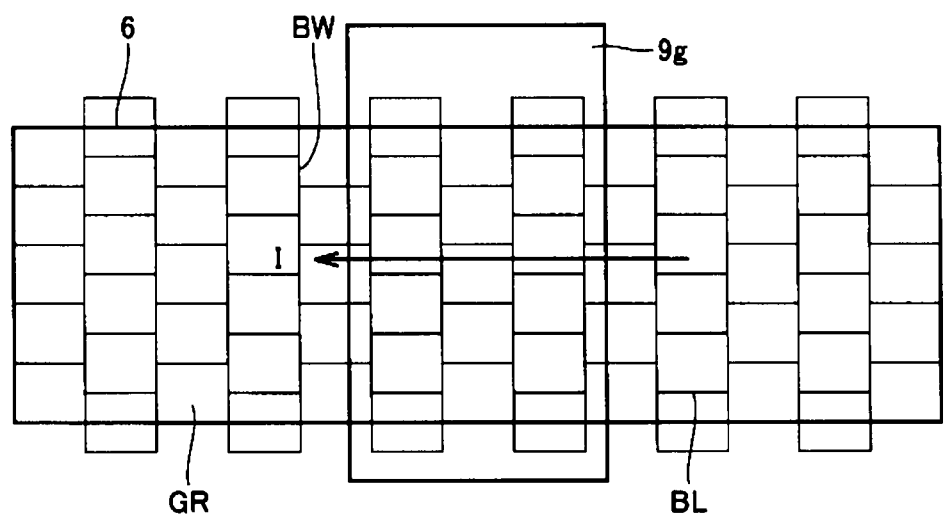
FIG. 28 is a plan view that diagrammatically shows a configuration of the channel region of the transistor in the semiconductor device in the fifth embodiment of the present invention.
Figure 29:
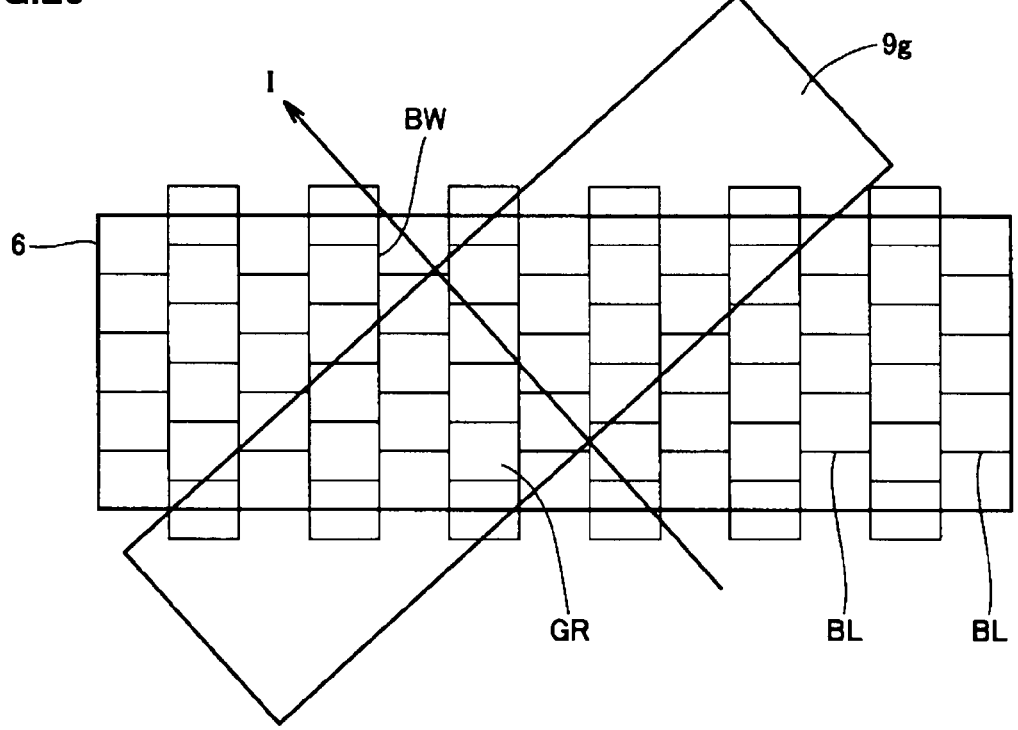
FIG. 29 is a plan view that diagrammatically shows a configuration of the channel region of a transistor related to the transistor in the semiconductor device in the fifth embodiment of the present invention.

It is noted that, when the channel direction is set along a direction IO that crosses both of direction IW and direction IL, the channel current is blocked by both of crystal grain boundaries BW and crystal grain boundaries BL. With reference to FIGS. 26-29 that represent the relation between the channel of the transistor and crystal grains, the relation between the channel direction and the direction of crystal grain boundaries will be described in detail. FIGS. 26 and 27 schematically show a crystal in which crystal grain boundaries are formed periodically in the direction of crystal grain boundaries BW and BL. FIGS. 28 and 29 schematically show a crystal in which crystal grain boundaries are formed periodically only in the direction of crystal grain boundaries BW. FIGS. 26 and 28 show the case where the channel direction, namely, the current direction (the direction of an arrow I in the drawing) is parallel to crystal grain boundaries BL. FIGS. 27 and 29 show the case where the current direction and each of crystal grain boundaries BL and crystal grain boundaries BW form an angle of 45°.

In the case where the current direction is parallel to crystal grain boundaries BL, comparison between FIG. 26 and FIG. 28 shows that the number of crystal grain boundaries BW that block the current is four, irrespective of whether or not crystal grain boundaries BL are formed periodically. In contrast, comparison between FIG. 26 and FIG. 27 shows that the number of crystal grain boundaries that block the current is increased to five in the case where the current direction and crystal grain boundaries BL form an angle of 45° (FIG. 27). This is because the current is blocked by both of crystal grain boundaries BW and crystal grain boundaries BL, as described above. Generally, if the channel direction and the direction of crystal grain boundaries BL or BW form an angle other than 0° or 90°, the current is inevitably blocked by both of crystal grain boundaries BW and crystal grain boundaries BL, so that current characteristics are deteriorated even if a silicon film has the same structure of crystal grain boundaries. Therefore, it is possible to maximize the channel current of the transistor when the channel direction is set in parallel to, or perpendicularly to the direction of crystal grain boundaries BW or crystal grain boundaries BL. Comparison between FIG. 26 and FIG. 28 shows that, even if crystal grain boundaries BL are not formed periodically in the case where the channel direction is set in parallel to, or perpendicularly to the direction of crystal grain boundaries BW or crystal grain boundaries BL, it is possible to obtain the same channel current as the channel current obtained in the case where both of crystal grain boundaries BL and BW are periodically formed.

It is noted that, in FIGS. 26 and 28, even if the channel direction is set to form an angle of 90° with respect to the channel direction in the drawing, the channel current is kept unchanged because the crystal grain boundaries that block the current are merely changed from crystal grain boundaries BW to crystal grain boundaries BL.

Next, description will be made on a method of manufacturing the above-described thin-film transistor. FIGS. 10-14 are cross-sectional views that schematically show first to fifth steps, respectively, of the step of manufacturing the thin-film transistor included in the semiconductor device in the fifth embodiment of the present invention.

Figure 10:
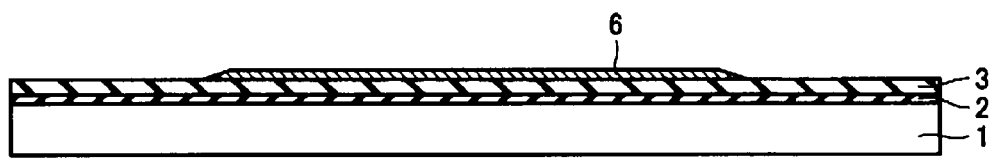
FIG. 10 is a cross-sectional view that schematically shows a first step of the step of manufacturing the thin-film transistor included in the semiconductor device in the fifth embodiment of the present invention.

With reference to FIG. 10, with a method similar to that of the first embodiment, diffusion-preventing film 2 such as an SiN film, insulating film 3 such as an $SiO_2$ film, and polycrystalline silicon film 6 are formed in this order on translucent substrate 1 such as a glass substrate. It is noted that polycrystalline silicon film 6 is formed to have a surface roughness Ra of 3 nm or less.

Next, polycrystalline silicon film 6 is patterned to a desired shape with use of a known photolithography process, to achieve an island-like shape. Etching carried out in association with the patterning is conducted by a dry etching method using, for example, a mixed gas of $CF_4$ and $O_2$. By using a gas including $O_2$ in dry etching, it becomes possible to etch polycrystalline silicon film 6 by allowing a sidewall of a resist, which has been formed in the photolithography process, to recede. It is thereby possible to allow each end portion of patterned polycrystalline silicon film 6 to have a taper shape.

Figure 11:
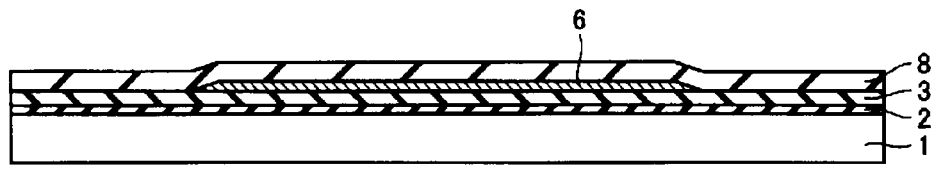
FIG. 11 is a cross-sectional view that schematically shows a second step of the step of manufacturing the thin-film transistor included in the semiconductor device in the fifth embodiment of the present invention.

With reference to FIG. 11, gate insulating film 8 made of a silicon oxide film and having a film thickness of approximately 50-100 nm, for example, is formed to coat the entire surface side of translucent substrate 1. As the film-forming method, it is possible to use a CVD method.

Figure 12:
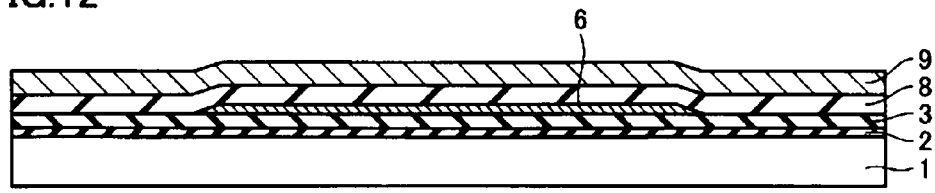
FIG. 12 is a cross-sectional view that schematically shows a third step of the step of manufacturing the thin-film transistor included in the semiconductor device in the fifth embodiment of the present invention.

With reference to FIG. 12, gate electrode film 9 made of Mo (molybdenum) and having a film thickness of 200-400 nm, for example, is formed. As the film-forming method, it is possible to use a sputtering method with use of DC magnetron. It is noted that, for the material of gate electrode film 9, it may also be possible to use Cr (chromium), W (tungsten), Al (aluminum), and Ta (tantalum), instead of Mo. It may also be possible to use an alloy mainly composed of each of the above-described elements.

Figure 13:
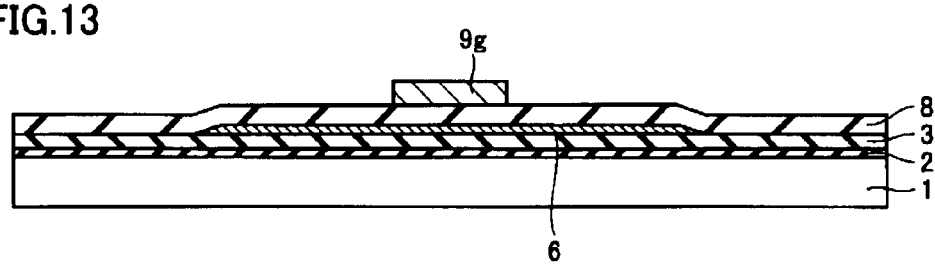
FIG. 13 is a cross-sectional view that schematically shows a fourth step of the step of manufacturing the thin-film transistor included in the semiconductor device in the fifth embodiment of the present invention.

Mainly with reference to FIGS. 12 and 13, gate electrode film 9 is patterned to a desired shape by a known photolithography process. The etching of gate electrode film 9 is conducted by a wet etching method that uses, for example, a phosphoric acid-based etching liquid. It is noted that the etching may also be conducted by a dry etching method that uses a mixed gas of $SF_6$ (sulfur hexafluoride) and $O_2$ (oxygen).

With this patterning, gate electrode 9g is formed from gate electrode film 9. Here, gate electrode 9g is formed to extend along direction IL running along the length direction of the beam shape of, or along direction IW running along the width direction of the beam shape of, laser beam LS, shown in FIG. 9.

Next, gate electrode 9g is used as a mask, and impurity elements are introduced into the source/drain regions of polycrystalline silicon film 6. As to the impurity elements to be introduced, P (phosphorus) or B (boron) can be used. An n-type transistor can be formed when P is introduced, and a p-type transistor can be formed when B is introduced. Further, when processing of gate electrode 9g is conducted in two separate steps for a gate electrode for an n-type transistor and a gate electrode for a p-type transistor, it is possible to form the n-type transistor and the p-type transistor separately on the same substrate. For introduction of impurity elements such as P and B, an ion doping method can be used.

Figure 14:
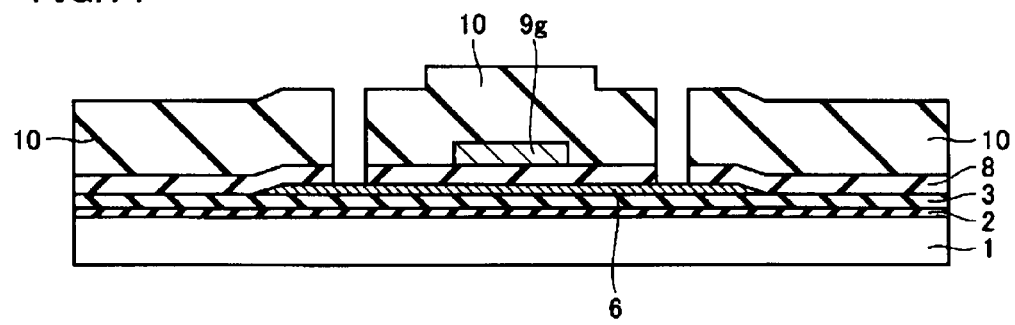
FIG. 14 is a cross-sectional view that schematically shows a fifth step of the step of manufacturing the thin-film transistor included in the semiconductor device in the fifth embodiment of the present invention.

With reference to FIG. 14, interlayer insulating film 10 is formed to coat the entire surface side of translucent substrate 1. Interlayer insulating film 10 is a silicon oxide film having a film thickness of, for example, approximately 500-1000 nm. Next, for the purpose of activating the impurity elements introduced into the source/drain regions in polycrystalline silicon film 6, a thermal treatment is conducted in a nitrogen atmosphere in an annealing furnace at 450° C. for one hour.

Next, gate insulating film 8 and interlayer insulating film 10 are patterned to a desired shape with use of a known photolithography process, so that contact holes reaching the source/drain regions in polycrystalline silicon film 6 are formed. Etching carried out during the patterning can be conducted by a dry etching method that uses a mixed gas of, for example, $CHF_3$ (methane trifluoride), $O_2$, and Ar (argon).

With reference to FIG. 8, a conductive film for forming wiring 11, which will be serve as source/drain electrodes, is formed. For the material of the conductive film, it is possible to use Mo, Cr, W, Al, Ta, or an alloy mainly composed thereof. Further, the conductive film may have a multilayer structure in which different materials are stacked. For example, it is possible to use a multilayer structure of Mo/Al/Mo in which an Al film having a film thickness of 200-400 nm is sandwiched between Mo films each having a film thickness of 50-150 nm. For the method of forming the conductive film, it is possible to use a sputtering method using DC magnetron.

Next, the above-described conductive film is patterned to a desired shape with use of a known photolithography process, resulting in wiring 11 that functions as source/drain electrodes. Etching carried out in the patterning may be conducted by a dry etching method that uses a mixed gas of $SF_6$ and $O_2$ and a mixed gas of $Cl_2$ and Ar. By doing so, the thin-film transistor shown in FIG. 8 is formed.

According to the present embodiment, polycrystalline silicon film 6 having uniform crystal grains GR as described in the first to fourth embodiments is made to serve as a channel region of the thin-film transistor. Owing to the structure of this channel region, variations in channel characteristics of the channel region are suppressed, so that it is possible to obtain a semiconductor device provided with a thin-film transistor having small variations in transistor characteristics.

Preferably, as shown in FIG. 9, the channel direction is set to be approximately the same as direction IL along the length direction of the beam shape of, or direction IW along the width direction of the beam shape of, laser beam LS. The channel current can thereby flow almost without being blocked by crystal grain boundaries BL or crystal grain boundaries BW. Furthermore, it becomes possible to uniformize the size and number of crystal grains GR present in the channel region of the thin-film transistor along the channel direction. It is thereby possible to suppress variations in transistor characteristics, which are caused by non-uniformity of crystal grains GR in the channel.

Moreover, a crystal grain diameter is approximately 380 nm, which is not so large, and thus crystal defects are less likely to occur in crystals. Therefore, impact ionization of carriers accelerated by an externally-applied electric field is less likely to occur, and electrons to be injected into gate insulating film 8 are reduced. Therefore, reliability of the thin-film transistor is improved. Furthermore, holes stored at the bottom of polycrystalline silicon film 6 are reduced, so that the source/drain withstand voltage in the thin-film transistor is increased.

Furthermore, polycrystalline silicon film 6 has small surface roughness Ra of 3 nm or less, so that gate insulating film 8 achieves high coverage, and early failures caused by electrical breakdown are reduced.

Furthermore, each end portion of polycrystalline silicon film 6 has a taper shape, so that gate insulating film 8 can favorably coat polycrystalline silicon film 6. It is thereby possible to suppress faults such as electrical breakdown of gate insulating film 8, and hence improve reliability of the thin-film transistor.

It is noted that, although the semiconductor device has translucent substrate 1 in the present embodiment, the present invention is not limited thereto. For example, by using a technique of transferring polycrystalline silicon film 6 from translucent substrate 1 to a non-transparent substrate, it is possible to obtain a semiconductor device having no translucent substrate 1.

In the first to fifth embodiments described above, polarization of the laser beam may be in any state. In other words, linearly-polarized light or circular-polarized light may be used.

Furthermore, although silicon is used as an amorphous thin film and a polycrystalline semiconductor thin film, another material may also be used.

It should be understood that each embodiment disclosed herein is illustrative and not limitative in all aspects. The scope of the present invention is shown not by the description above but by the scope of the claims, and is intended to include all modifications within the equivalent meaning and scope of the claims.

INDUSTRIAL APPLICABILITY

The present invention can particularly advantageously be applied to a method of manufacturing a semiconductor thin film and a semiconductor device.

The invention claimed is:

1. A method of manufacturing a semiconductor thin film, comprising:
   depositing a diffusion-preventing film on a translucent substrate;
   depositing an insulating film having a refractive index n on the diffusion-preventing film;
   depositing an amorphous thin film on the insulating film; and
   forming a polycrystalline semiconductor thin film from the amorphous thin film by irradiating the amorphous thin film from a bottom of the insulating film with a laser beam which has a beam shape of a band shape extending along a length direction and has a wavelength $\lambda$, a plurality of times from a lower side of the amorphous thin film facing the insulating film in a direction so that the laser beam passes through the substrate, the diffusion-preventing film, and the insulating film to the amorphous thin film, while an irradiation position of the laser beam is shifted each of the plurality of times in a width direction of the band shape by a distance smaller than a width dimension of the band shape, wherein
   forming the polycrystalline semiconductor thin film being conducted to form crystal grain boundaries which extend in the width direction and are disposed at a mean spacing measured along the length direction and ranging from $(\lambda/n)\times 0.95$ to $(\lambda/n)\times 1.05$ inclusive, and crystal grain boundaries which, in a region between crystal grain boundaries adjacent to each other and extending in the width direction, extend in the length direction and are disposed at a mean spacing measured along the width direction and ranging from $(\lambda/n)\times 0.95$ to $(\lambda/n)\times 1.05$ inclusive.

2. The method of manufacturing the semiconductor thin film according to claim 1, wherein the crystal grain boundaries which extend in the length direction and are adjacent to each other with a crystal grain boundary extending in the width direction interposed therebetween, are formed to be aligned along the length direction.

3. The method of manufacturing the semiconductor thin film according to claim 1, wherein the amorphous thin film is deposited such that the semiconductor thin film has a film thickness ranging from 60 nm to 150 nm inclusive.

4. The method of manufacturing the semiconductor thin film according to claim 1, wherein the wavelength $\lambda$ ranges from 390 nm to 640 nm inclusive.

5. The method of manufacturing the semiconductor thin film according to claim 1, wherein the refractive index n of the insulating film ranges from 1.4 to 2.0 inclusive.

6. The method of manufacturing the semiconductor thin film according to claim 1, wherein the insulating film is deposited such that its surface has a mean roughness ranging from 0.5 nm to 2.0 nm inclusive.

7. The method of manufacturing the semiconductor thin film according to claim 1, further comprising;
   prior to forming the polycrystalline semiconductor thin film, providing, at a surface of the insulating film, a concave and convex shape having a period of kin in at least any of the length direction and the width direction of the band shape.

8. The method of manufacturing the semiconductor thin film according to claim 1, wherein the semiconductor thin film contains silicon.

9. The method of manufacturing the semiconductor thin film according to claim 1, wherein depositing the insulating film is conducted by a CVD method which uses a mixed gas having a flow ratio of $SiH_4$, $NH_3$ and $N_2O$ adjusted to allow the insulating film to have the refractive index n.

* * * * *